US012598992B2

(12) United States Patent
Sato

(10) Patent No.: US 12,598,992 B2
(45) Date of Patent: Apr. 7, 2026

(54) TERMINAL STRUCTURE, METHOD FOR MANUFACTURING TERMINAL STRUCTURE, AND SEMICONDUCTOR APPARATUS

(71) Applicant: FUJI ELECTRIC CO., LTD., Kawasaki (JP)

(72) Inventor: Tadahiko Sato, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 383 days.

(21) Appl. No.: 18/184,857

(22) Filed: Mar. 16, 2023

(65) Prior Publication Data

US 2023/0386966 A1      Nov. 30, 2023

(30) Foreign Application Priority Data

May 31, 2022      (JP) ................................. 2022-088509

(51) Int. Cl.
  *H01L 23/40*          (2006.01)
  *H01L 21/48*          (2006.01)
  (Continued)

(52) U.S. Cl.
  CPC ...... *H01L 23/4006* (2013.01); *H01L 21/4814* (2013.01); *H01L 23/04* (2013.01);
  (Continued)

(58) Field of Classification Search
  CPC ... H01L 23/4006; H01L 23/04; H01L 23/481; H01L 23/5386; H01L 21/4814; H01L 23/48; H01R 4/302; H01R 43/16
  See application file for complete search history.

(56) References Cited

U.S. PATENT DOCUMENTS 2,303,148 A * 11/1942 Tinnerman ............ F16B 37/043
                                                                411/111
2,585,728 A *  2/1952 Bedford, Jr. .......... F16B 37/044
                                                                411/970
(Continued)

FOREIGN PATENT DOCUMENTS

JP          S60-46669 U      4/1985
JP          S62-65774 U      4/1987
            (Continued)

OTHER PUBLICATIONS

Office Action issued for corresponding Japanese patent application No. JP2022-088509 on Feb. 3, 2026.

*Primary Examiner* — Allen L Parker
*Assistant Examiner* — Martin Antonio Asmat Uceda
(74) *Attorney, Agent, or Firm* — Rabin & Berdo, P.C.

(57) ABSTRACT

A terminal structure includes a pair of plate sections including first and second plate sections respectively provided spaced apart from each other in a thickness direction of the nut, a connection plate section extending in the thickness direction of the nut and connects respective one ends of the pair of plate sections to each other, a terminal section protruding from the other end of the first plate section of the pair of plate sections and faces the connection plate section, and a holding section provided at at least one of the connection plate section or the terminal section, and restricting rotation of the nut and movement of the nut in a direction intersecting the thickness direction. The pair of plate sections, the connection plate section, the terminal section, and the holding section are constituted by one plate-shaped body.

13 Claims, 18 Drawing Sheets

(51) Int. Cl.

| | |
|---|---|
| *H01L 23/04* | (2006.01) |
| *H01L 23/48* | (2006.01) |
| *H01L 23/538* | (2006.01) |
| *H01R 4/30* | (2006.01) |
| *H01R 43/16* | (2006.01) |

(52) U.S. Cl.
CPC ............ *H01L 23/48* (2013.01); *H01L 23/481* (2013.01); *H01L 23/5386* (2013.01); *H01R 4/302* (2013.01); *H01R 43/16* (2013.01)

(56) References Cited

U.S. PATENT DOCUMENTS

| | | | | |
|---|---|---|---|---|
| 2,633,886 | A * | 4/1953 | Tinnerman | F16B 37/041 |
| | | | | 411/970 |
| 3,126,038 | A * | 3/1964 | Jaworski | F16B 37/044 |
| | | | | 411/112 |
| 3,559,156 | A * | 1/1971 | Coley | H01H 71/08 |
| | | | | 439/752 |
| 4,408,939 | A * | 10/1983 | Graff | F16B 37/041 |
| | | | | 411/174 |
| 4,629,281 | A * | 12/1986 | Kruger | H01R 12/728 |
| | | | | 439/815 |
| 4,961,553 | A * | 10/1990 | Todd | F16L 3/243 |
| | | | | 248/62 |
| 5,189,596 | A * | 2/1993 | Runge | H02B 1/20 |
| | | | | 174/68.2 |
| 5,373,105 | A * | 12/1994 | Nagaune | H01L 23/04 |
| | | | | 429/170 |
| 5,490,044 | A * | 2/1996 | Kobayashi | H01R 4/34 |
| | | | | 361/752 |
| 5,493,085 | A * | 2/1996 | Kolberg | H01R 4/34 |
| | | | | 361/624 |
| 6,102,750 | A * | 8/2000 | Little | H01R 4/302 |
| | | | | 439/813 |
| 6,521,983 | B1 * | 2/2003 | Yoshimatsu | H01L 25/072 |
| | | | | 257/E25.031 |
| 6,858,343 | B2 * | 2/2005 | Wang | H01R 4/302 |
| | | | | 429/178 |
| 7,384,317 | B1 * | 6/2008 | Pijoan Parellada | H01R 4/363 |
| | | | | 439/814 |
| 7,541,670 | B2 * | 6/2009 | Matsumoto | H05K 7/1432 |
| | | | | 257/713 |
| 7,848,112 | B2 * | 12/2010 | Matsumoto | H01R 4/04 |
| | | | | 361/730 |
| 8,083,450 | B1 * | 12/2011 | Smith | F16B 37/0842 |
| | | | | 411/173 |
| 8,177,466 | B2 * | 5/2012 | Csik | F16B 37/043 |
| | | | | 411/174 |
| 8,202,134 | B2 * | 6/2012 | Moon | H01M 50/103 |
| | | | | 439/878 |
| 8,519,265 | B2 * | 8/2013 | Nakao | H01L 25/072 |
| | | | | 361/752 |
| 8,523,604 | B2 * | 9/2013 | Akuta | H01R 43/18 |
| | | | | 439/502 |

| | | | | |
|---|---|---|---|---|
| 9,390,987 | B2 * | 7/2016 | Oose | H01L 23/049 |
| 9,698,504 | B2 * | 7/2017 | Nobukuni | H01R 11/287 |
| 10,070,527 | B2 * | 9/2018 | Kodaira | H05K 1/18 |
| 10,408,252 | B2 * | 9/2019 | Reznar | F16B 37/046 |
| 11,549,545 | B2 * | 1/2023 | Brück | H02B 1/012 |
| 11,935,820 | B2 * | 3/2024 | Yamanaka | H01L 23/48 |
| 12,074,090 | B2 * | 8/2024 | Adachi | H01L 23/4006 |
| 12,270,428 | B2 * | 4/2025 | Mahaffey | F16B 37/043 |
| 12,300,929 | B2 * | 5/2025 | Matthias | H01L 24/48 |
| 2003/0186121 | A1 * | 10/2003 | Wang | H01R 4/302 |
| | | | | 429/178 |
| 2011/0273861 | A1 * | 11/2011 | Matsumoto | H01L 23/3735 |
| | | | | 361/820 |
| 2012/0181682 | A1 * | 7/2012 | Soyano | H01L 25/072 |
| | | | | 257/E23.06 |
| 2012/0186872 | A1 * | 7/2012 | Akuta | H01R 4/38 |
| | | | | 174/70 B |
| 2013/0058068 | A1 * | 3/2013 | Funatsu | H05K 7/20927 |
| | | | | 361/820 |
| 2014/0346659 | A1 * | 11/2014 | Nakamura | H01L 23/3735 |
| | | | | 438/107 |
| 2015/0079855 | A1 | 3/2015 | Takemura | |
| 2015/0093930 | A1 * | 4/2015 | Ishikawa | H01R 13/627 |
| | | | | 439/357 |
| 2017/0047670 | A1 * | 2/2017 | Nobukuni | H01R 11/283 |
| 2017/0077626 | A1 * | 3/2017 | Yamada | H01R 11/283 |
| 2020/0052420 | A1 * | 2/2020 | Mitsumoto | H01R 4/305 |
| 2020/0058600 | A1 * | 2/2020 | Murakami | H02K 11/0094 |
| 2020/0124078 | A1 * | 4/2020 | Brück | H02B 1/012 |
| 2020/0266117 | A1 | 8/2020 | Nakata | |
| 2021/0320055 | A1 * | 10/2021 | Oomori | H01L 25/18 |
| 2021/0375786 | A1 * | 12/2021 | Kaneko | H01L 23/04 |
| 2022/0122902 | A1 * | 4/2022 | Adachi | H01L 23/24 |
| 2022/0254758 | A1 * | 8/2022 | Hayashiguchi | H01L 24/40 |
| 2023/0069967 | A1 * | 3/2023 | Higashi | H01L 23/24 |
| 2023/0207427 | A1 * | 6/2023 | Takahashi | H01R 43/18 |
| | | | | 257/734 |
| 2024/0039182 | A1 * | 2/2024 | Yokotani | H01R 4/30 |

FOREIGN PATENT DOCUMENTS

| | | | |
|---|---|---|---|
| JP | S62-180870 U | | 11/1987 |
| JP | H08321335 A | | 12/1996 |
| JP | 3095796 U | | 8/2003 |
| JP | 2010-027410 A | | 2/2010 |
| JP | 2010-258358 A | | 11/2010 |
| JP | 2011-245848 A | | 12/2011 |
| JP | 2014036558 A | | 2/2014 |
| JP | 2014081063 A | * | 5/2014 |
| JP | 2015-060680 A | | 3/2015 |
| JP | 2015-069772 A | | 4/2015 |
| JP | 2017-188289 A | | 10/2017 |
| JP | 2017-224563 A | | 12/2017 |
| JP | 2021-190553 A | | 12/2021 |
| WO | 2019/087327 A1 | | 5/2019 |
| WO | 2020/035931 A1 | | 2/2020 |
| WO | 2021/010210 A1 | | 1/2021 |

* cited by examiner

PROCESS 1        PROCESS 2        PROCESS 3

ARROW A VIEW

ARROW B VIEW                    ARROW C VIEW

ARROW A VIEW

ARROW B VIEW ARROW C VIEW

TERMINAL STRUCTURE, METHOD FOR MANUFACTURING TERMINAL STRUCTURE, AND SEMICONDUCTOR APPARATUS

CROSS REFERENCE TO RELATED APPLICATIONS

This application is based upon and claims the benefit of priority of the prior Japanese Patent Application No. 2022-088509, filed on May 31, 2022, the entire contents of which are incorporated herein by reference.

BACKGROUND OF THE INVENTION

Field of the Invention

The present invention relates to a terminal structure, a method for manufacturing the terminal structure, and a semiconductor apparatus.

Description of the Related Art

A semiconductor apparatus (a semiconductor module) provided with a semiconductor device such as an insulated gate bipolar transistor (IGBT), a power metal oxide semiconductor field effect transistor (MOSFET), or a free wheeling diode (FWD) is used in various fields such as a motor drive control inverter. In this type of semiconductor apparatus, it is desirable to implement fastening of a main terminal to an external conductor in a simple and low-cost structure.

As means for fastening the main terminal, a screw (a male screw, a bolt) and a nut are used in many cases. For example, there has been known a structure in which a main terminal is provided with a through hole through which a screw penetrates and a nut prepared as a separate component is threaded into the screw penetrating through the through hole to fasten the main terminal and an external conductor to each other. Alternatively, there has been a fastening structure of a type in which a case member constituting a semiconductor apparatus is provided with a nut housing section and a screw is threaded into a nut housed in the nut housing section to fasten a main terminal and an external conductor to each other.

A fastening structure of a type in which a screw and a nut are individually prepared and attached has had a problem that it takes time and effort for preparation and attachment work of components. In a fastening structure of a type in which a nut is incorporated into a nut housing section in a case member, the nut housing section needs to have a high strength to withstand a torque to be exerted on the nut, and a wall thickness is large when the case member is formed of synthetic resin or the like, thereby making it difficult to miniaturize a semiconductor apparatus.

As one idea for solving the problem, there has been known a terminal of a type into which a nut is incorporated (e.g., Japanese Patent Laid-Open No. 2014-81063 and Japanese Utility Model Laid-Open Nos. S60-46669, S62-180870 and S62-65774).

CITATION LIST

Patent Literature

Patent Literature 1: Japanese Patent Laid-Open No. 2014-81063

Patent Literature 2: Japanese Utility Model Laid-Open No. S60-46669

Patent Literature 3: Japanese Utility Model Laid-Open No. S62-180870

Patent Literature 4: Japanese Patent Laid-Open No. 2011-245848

Patent Literature 5: Japanese Patent Laid-Open No. 2015-60680

Patent Literature 6: Japanese Patent Laid-Open No. 2015-69772

Patent Literature 7: Japanese Patent Laid-Open No. 2017-188289

Patent Literature 8: Japanese Patent Laid-Open No. 2017-224563

Patent Literature 9: Japanese Utility Model Laid-Open No. S62-65774

Patent Literature 10: Japanese Patent Laid-Open No. 2010-27410

Patent Literature 11: Japanese Patent Laid-Open No. 2010-258358

Patent Literature 12: International Publication No. WO 2021/010210 A1

Patent Literature 13: Japanese Patent Laid-Open No. 2021-190553

Patent Literature 14: International Publication No. WO 2020/035931 A1

Patent Literature 15: International Publication No. WO 2019/087327 A1

SUMMARY OF THE INVENTION

In Japanese Patent Laid-Open No. 2014-81063, square holes are respectively formed in two legs protruding from a bottom portion of a terminal member, and respective vertexes of diagonals of a hexagonal nut are respectively inserted into the square holes to prevent the hexagonal nut from spinning. However, an upper part of the bottom portion of the terminal is opened, and upper and lower surfaces of the hexagonal nut are not held from both sides. Accordingly, there is a problem that the stability of the hexagonal nut in a thickness direction of the nut is not ensured. To prevent the hexagonal nut from dropping in the thickness direction of the nut to stabilize the hexagonal nut, a separate member that covers the opened part of the terminal from above is required, the number of components is large, and extra time and effort and cost for manufacture are required.

In Japanese Utility Model Laid-Open No. 60-46669, respective parts on both sides of an upper surface plate of a terminal member are bent to form a pair of holding members, and a hexagonal nut is inserted and held between the upper surface plate and the pair of holding members. A distal end of the pair of holding members is folded to form a claw section, and the claw section prevents the hexagonal nut from dropping downward. In such a configuration, the small-sized claw section only engages with the vicinity of a peripheral edge of a lower surface of the hexagonal nut. Accordingly, a strength may be insufficient to receive a large torque to be exerted on the hexagonal nut, and the terminal member may be deformed such that the claw section is opened so that the hexagonal nut may drop.

In Japanese Utility Model Laid-Open No. 62-180870, a square nut is loosely fitted between an upper plate and a lower plate of a fitting main body, to form a mounting section of an electric wire connection terminal. The terminal has a loosely fitting structure in which the square nut is arranged to be spaced apart from the upper plate and the lower plate. Accordingly, there is a problem that the terminal does not easily receive a large torque to be exerted on the nut and does not easily increase a fastening strength using the nut. The terminal has a doublet structure in which separate upper and lower plates are combined with each other. Accordingly, there is a problem that the number of components is large so that the structure is complicated and processing cost increases.

Thus, even in the terminal of a type into which the nut is incorporated, there have been requests for a further simplification in structure, improvement in load resistance, and reduction in cost, for example.

The present invention has been made in view of such points, and one of its objects is to obtain a terminal structure into which a nut can be incorporated with a simple configuration and at low cost, a method for manufacturing the terminal structure, and a semiconductor apparatus.

According to an aspect of the present invention, a terminal structure includes a pair of plate sections including a first plate section and a second plate section each extending in a plate direction, the pair of plate sections being spaced apart from each other in a thickness direction of a nut for sandwiching the nut from the thickness direction, a connection plate section that extends in the thickness direction of the nut and connects one of two ends in the plate direction of each of the first and second plate sections to each other, a terminal section that protrudes from the other one of the two ends of the first plate section and faces the connection plate section, and a holding section provided at at least one of the connection plate section or the terminal section, and restricting rotation of the nut and movement of the nut in a direction orthogonal to the thickness direction, in which the pair of plate sections, the connection plate section, the terminal section, and the holding section are constituted by one plate-shaped body.

According to the present invention, a nut can be held in all directions by a simple terminal having an integral structure. Accordingly, there can be obtained a terminal into which a nut is incorporated with a simple configuration and at low cost.

DETAILED DESCRIPTION OF THE PREFERRED EMBODIMENTS

Figure 1:
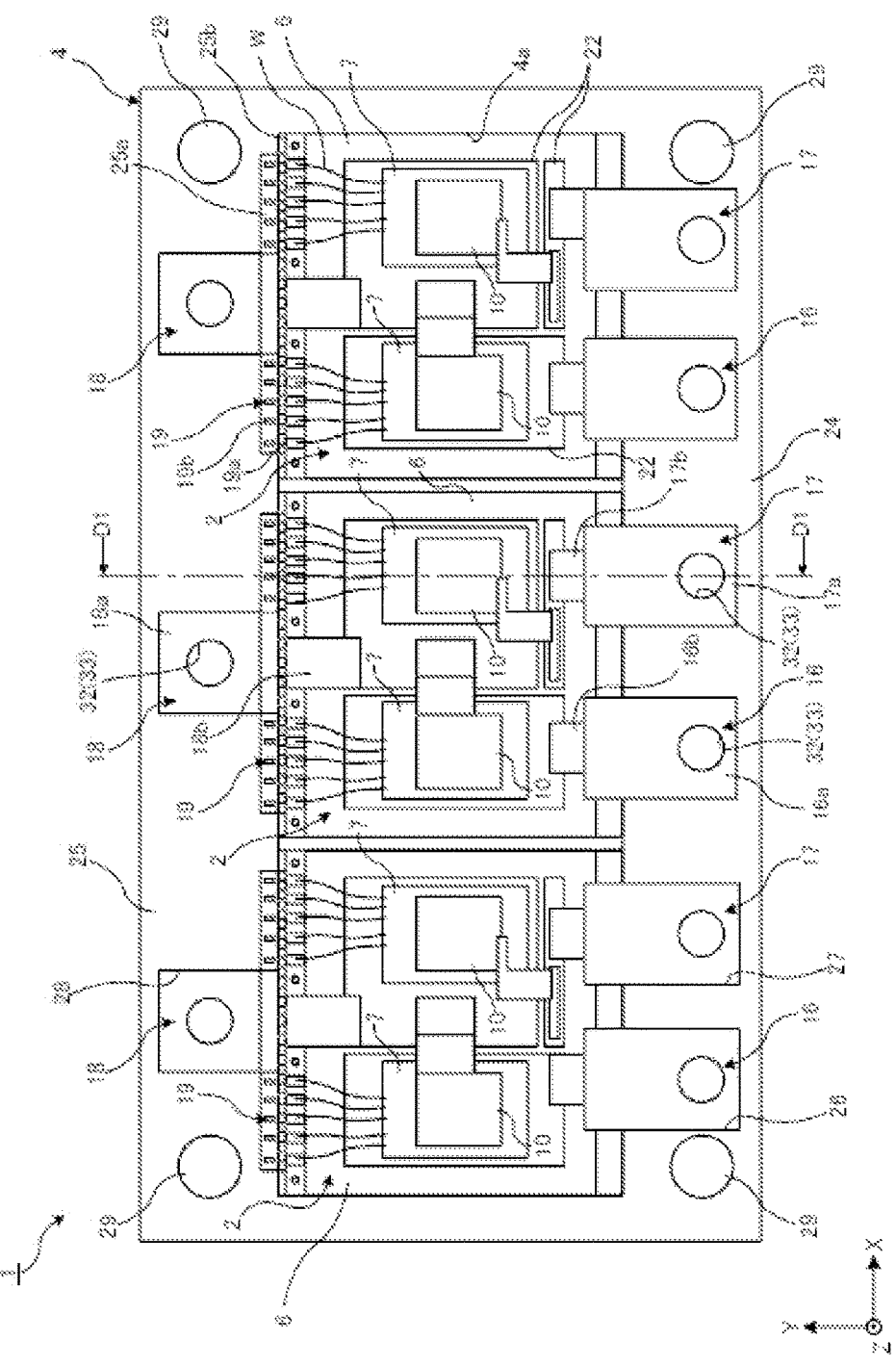
FIG. 1 is a plan view of a semiconductor apparatus according to the present embodiment.
Figure 2:
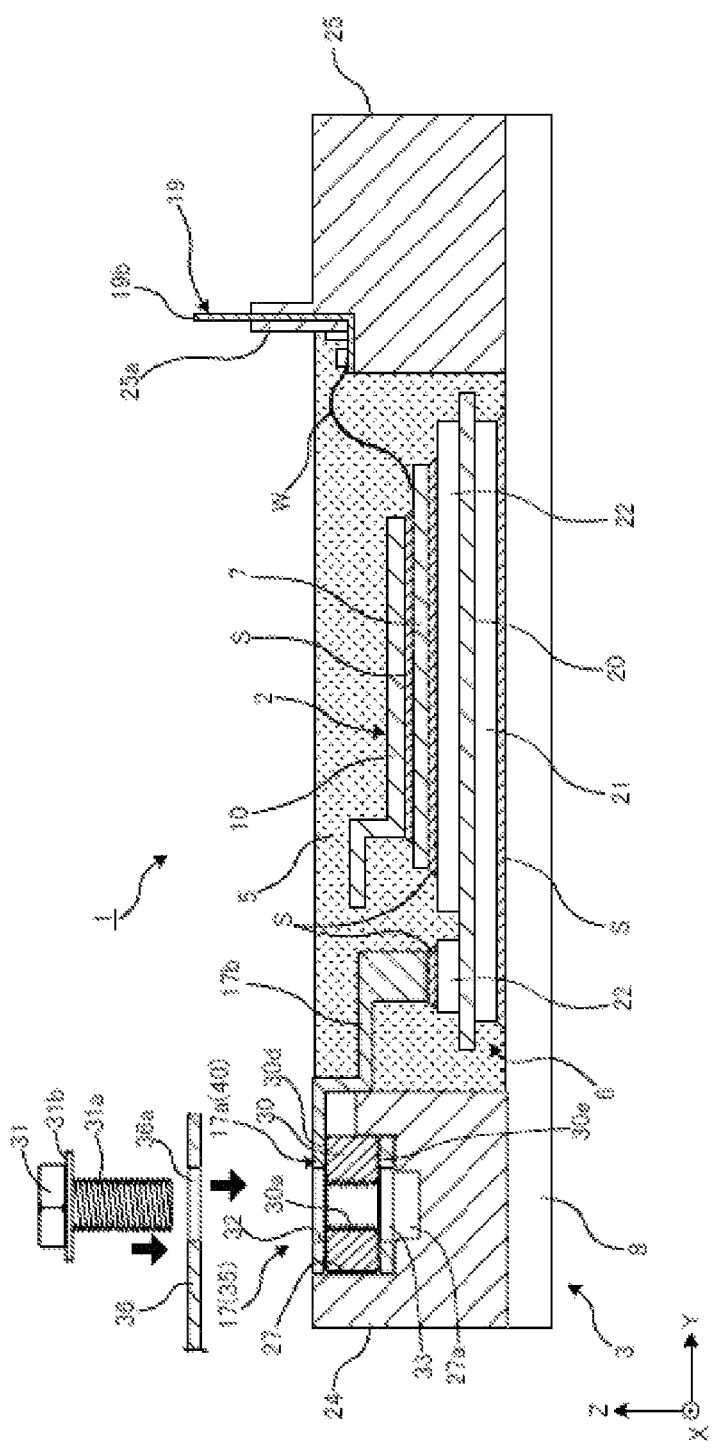
FIG. 2 is a cross-sectional view taken along a line D1-D1 illustrated in FIG. 1.
Figure 3:
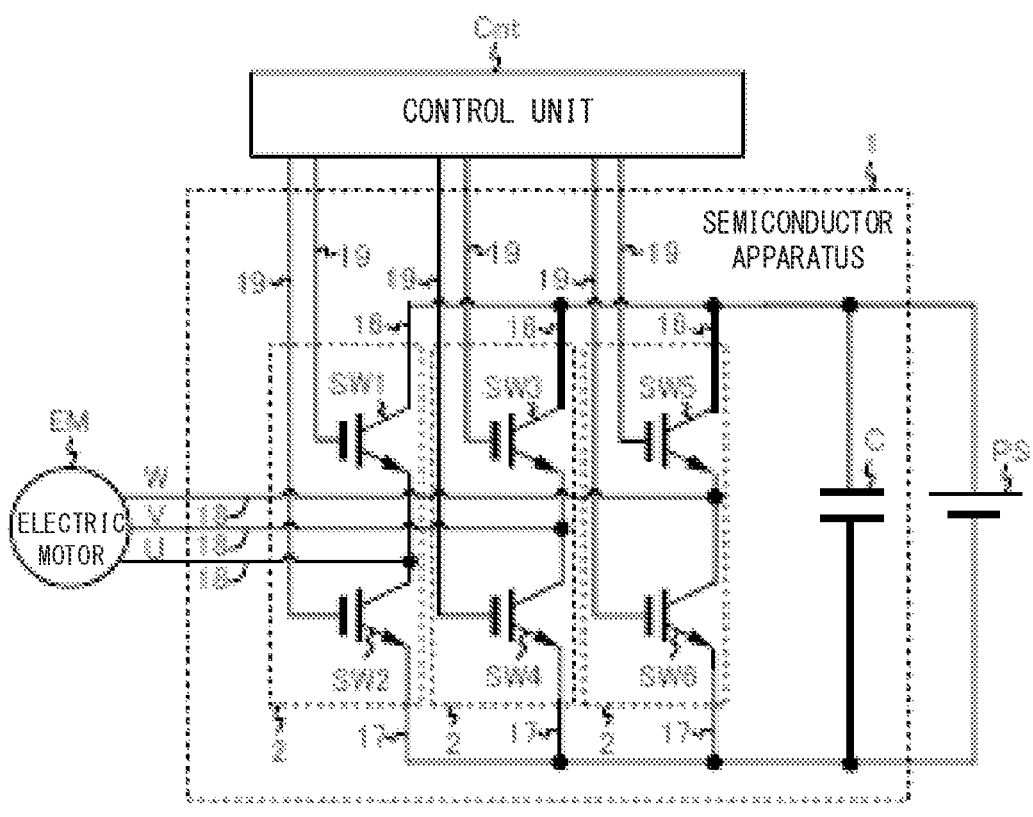
FIG. 3 is a schematic view illustrating an example of a circuit configuration of the semiconductor apparatus according to the present embodiment.

A semiconductor apparatus to which the present invention is applicable will be described below. FIG. 1 is a plan view of the semiconductor apparatus according to the present embodiment. FIG. 2 is a cross-sectional view taken along a line D1-D1 illustrated in FIG. 1. FIG. 3 is a schematic view illustrating an example of a circuit configuration of the semiconductor apparatus according to the present embodiment. A semiconductor apparatus described below is merely an example and is not limited to this, but is appropriately changeable.

In the following drawings, a longitudinal direction of the semiconductor apparatus, a short direction of the semiconductor apparatus, and a height direction (a thickness direction of a substrate) are respectively defined as an X-direction, a Y-direction, and a Z-direction. The longitudinal direction of the semiconductor apparatus represents a direction in which a plurality of semiconductor modules (unit modules) are arranged. X-, Y-, and Z-axes as illustrated are perpendicular to one another. In some cases, the X-direction, the Y-direction, and the Z-direction may be respectively referred to as a left-right direction, a front-rear direction, and an up-down direction. The directions (front-rear, left-right, and up-down directions) are phrases used for convenience of illustration, and a correspondence with each of the X-, Y-, and Z-directions may change depending on an attachment posture of the semiconductor apparatus. In this specification, a planar view means a case where an upper surface or a lower surface of the semiconductor apparatus is viewed in the Z-direction.

A semiconductor apparatus 1 according to the present embodiment is a power semiconductor module that is applied to a power conversion apparatus such as a power control unit and constitutes an inverter circuit. As illustrated in FIG. 1 and FIG. 2, the semiconductor apparatus 1 includes a plurality of (three in the present embodiment) unit modules 2, a cooler 3 that cools the unit modules 2, a case member 4 that houses the plurality of unit modules 2, and sealing resin 5 to be injected into the case member 4. In FIG. 1, illustration of the sealing resin 5 is omitted for the purpose of illustrating an internal structure of the semiconductor apparatus 1.

Each of the unit modules 2 includes an insulating substrate 6 and a semiconductor device 7 arranged on the insulating substrate 6. In the present embodiment, the three unit modules 2 are arranged side by side in the X-direction. The three unit modules 2 respectively constitute a U phase, a V phase, and a W phase from the positive side in the X-direction, for example, and form a three-phase inverter circuit as a whole. The unit module 2 may be referred to as a power cell or a semiconductor unit.

The cooler 3 includes a base plate 8 formed in a rectangular shape in a planar view. The base plate 8 is formed of a plate-shaped body having a rectangular shape in a planar view and having a predetermined thickness. A longitudinal direction of the base plate 8 extends in the left-right direction (X-direction) of the semiconductor apparatus 1, and a short direction of the base plate 8 extends in the front-rear direction (Y-direction) of the semiconductor apparatus 1. The base plate 8 has one surface (lower surface) and the other surface (upper surface). The one surface forms a heat dissipation surface of the unit module 2, and the other surface forms a bonding surface of the unit module 2.

The base plate 8 is formed of a material having high heat dissipation (e.g., an alloy of aluminum or copper, etc.). A plating layer having a predetermined thickness is formed on a surface of the base plate 8. The plating layer is preferably formed of a plating of a metal such as nickel. The insulating substrate 6 is arranged on the upper surface of the base plate 8 with a bonding material S such as solder interposed therebetween. A plurality of fins for improving heat dissipation may be provided on the lower surface of the base plate 8.

The insulating substrate 6 is composed of a direct copper bonding (DCB) substrate, an active metal brazing (AMB) substrate, or a metal base substrate, for example. Specifically, the insulating substrate 6 includes an insulating plate 20, a heat dissipation plate 21 arranged on a lower surface of the insulating plate 20, and a plurality of circuit boards 22 arranged on an upper surface of the insulating plate 20. The insulating substrate 6 is formed in a rectangular shape in a planar view, for example.

The insulating plate 20 is formed of an insulating material such as a ceramic material such as alumina ($Al_2O_3$), aluminum nitride (AlN), or silicon nitride ($Si_3N_4$), a resin material such as epoxy, or an epoxy resin material using a ceramic material as a filler. The insulating plate 20 may also be referred to as an insulating layer or an insulating film.

The heat dissipation plate 21 has a predetermined thickness in the Z-direction, and is formed to cover the lower surface of the insulating plate 20. The heat dissipation plate is formed of a metal plate having a good thermal conductivity such as copper or aluminum, for example.

A plurality of circuit boards 22 are formed on the upper surface of the insulating plate 20. The circuit boards 22 are each a metal layer such as a copper foil and are respectively formed into island shapes while being electrically insulated from one another on the insulating plate 20. The circuit board 22 may also be referred to as a circuit layer.

The semiconductor device 7 is arranged on an upper surface of the insulating substrate 6 (the circuit boards 22) with the bonding material S such as solder interposed therebetween. Although two semiconductor devices 7 are illustrated for one insulating substrate 6 for convenience of illustration in FIG. 1, more semiconductor devices 7 may be arranged on the insulating substrate 6. The semiconductor device 7 is formed into a square shape or a rectangular shape in a planar view of a semiconductor substrate, such as a silicon (Si) substrate, a silicon carbide (SiC) substrate, a gallium nitride (GaN) substrate, or a diamond substrate, for example.

A switching device such as an insulated gate bipolar transistor (IGBT), a power metal oxide semiconductor field effect transistor (MOSFET) or a diode such as a free wheeling diode (FWD) is used as the semiconductor device

7. The switching device and the diode may be connected in reverse parallel to each other. As the semiconductor device 7, a reverse conducting (RC)-IGBT device obtained by integrating an IGBT and an FWD, a power MOSFET device, or a reverse blocking (RB)-IGBT having a sufficient withstand voltage to a reverse bias, for example, may be used.

A shape, the number of arrangements, and an arrangement portion, and the like of the semiconductor device 7 are appropriately changeable. Although the semiconductor device 7 in the present embodiment may be a vertical switching device obtained by forming functional devices such as transistors on a semiconductor substrate, the semiconductor device 7 is not limited to this, but may be a horizontal switching device.

An upper surface electrode of the semiconductor device 7 is conductively connected to the predetermined circuit board 22 via a metal wiring board 10. The metal wiring board 10 is formed by being folded through press working or the like using a metal material such as a copper material, a copper alloy-based material, an aluminum alloy-based material, or an iron alloy-based material, for example. For example, the semiconductor device 7 and one end of the metal wiring board 10 are bonded to each other with the bonding material S such as solder. The predetermined circuit board 22 and the other end of the metal wiring board 10 are bonded to each other with the bonding material S such as solder. The metal wiring board 10 may be referred to as a lead frame.

The case member 4 is arranged on the outer periphery on the upper surface of the base plate 8. The case member 4 is bonded to the base plate 8 with an adhesive, for example, interposed therebetween. The case member 4 has a shape along an outer shape of the base plate 8. More specifically, the case member 4 is formed into a rectangular frame shape having an opening section 4a at its center. The three unit modules 2, described above, are housed in the opening section 4a having a rectangular shape. That is, the three unit modules 2 are housed in a space to be defined by the frame-shaped case member 4.

The case member 4 is provided with a main terminal (a P terminal 16, an N terminal 17, and an M terminal 18) for external connection and a control terminal 19 for control. Recesses 26 and 27 each having a rectangular shape in a planar view are formed on a wall section 24 positioned on the negative side in the Y-direction in a pair of wall sections 24 and 25 opposing each other in the short direction (the Y-direction) of the case member 4.

A fastening section 16a in the P terminal 16 is arranged in the recess 26. One P terminal 16 is arranged for each of the unit modules 2. The P terminal 16 is formed by integrally molding the fastening section 16a and a plate-shaped section 16b. The fastening section 16a is provided on the side of one end (proximal end) of the plate-shaped section 16b.

The plate-shaped section 16b has a flat plate shape having an upper surface and a lower surface. The plate-shaped section 16b has an elongated shape extending in the Y-direction in a planar view. The other end (distal end) of the plate-shaped section 16b is bonded to the circuit board 22 in the insulating substrate 6 with the bonding material S such as solder interposed therebetween.

Similarly, a fastening section 17a in the N terminal 17 is arranged in the recess 27. One N terminal 17 is arranged for each of the unit modules 2. The N terminal 17 is formed by integrally molding the fastening section 17a and a plate-shaped section 17b. The fastening section 17a is provided on the side of one end (proximal end) of the plate-shaped section 17b.

The plate-shaped section 17*b* has a flat plate shape having an upper surface and a lower surface. The plate-shaped section 17*b* has an elongated shape extending in the Y-direction in a planar view. The other end (distal end) of the plate-shaped section 17*b* is bonded to the circuit board 22 in the insulating substrate 6 with the bonding material S such as solder interposed therebetween.

A recess 28 having a rectangular shape in a planar view is formed on the wall section 25 on the positive side in the Y-direction in the pair of wall sections 24 and 25 opposing each other in the short direction (the Y-direction) of the case member 4. A fastening section 18*a* in the M terminal 18 is arranged in the recess 28. One M terminal 18 is arranged for each of the unit modules 2. The M terminal 18 is formed by integrally molding the fastening section 18*a* and a plate-shaped section 18*b*. The fastening section 18*a* is provided on the side of one end (proximal end) of the plate-shaped section 18*b*.

The plate-shaped section 18*b* has a flat plate shape having an upper surface and a lower surface. The plate-shaped section 18*b* has an elongated shape extending in the Y-direction in a planar view. The other end (distal end) of the plate-shaped section 18*b* is bonded to the circuit board 22 in the insulating substrate 6 with the bonding material S such as solder interposed therebetween.

Although only a structure of the fastening section 17*a* is illustrated in FIG. 2, the fastening section 16*a* and the fastening section 18*a* each have similar structures. As illustrated in FIG. 2, the fastening section 17*a* (16*a*, 18*a*) is housed in the recess 27 (26, 28) with a nut 30 held therein. The nut 30 is a hexagonal nut having a hexagonal outer surface, and has a screw hole 30*a* penetrating therethrough in the Z-direction. A male screw section 31*a* in a fastening screw 31 is inserted into through holes 32 and 33 provided in the fastening section 17*a* (16*a*, 18*a*) and a through hole 36*a* in an external conductor 36 overlapping an upper surface of the fastening section 17*a* (16*a*, 18*a*), and is threaded into the screw hole 30*a* in the nut 30, whereby the external conductor 36 can be fastened to the fastening section 17*a* (16*a*, 18*a*). The fastening section 17*a* (16*a*, 18*a*) is housed in the recess 27 (26, 28) with rotation thereof and movements thereof in the X-direction and the Y-direction regulated. The fastening screw 31 is threaded into the nut 30 so that a torque can be applied thereto. A configuration of the fastening section 17*a* (16*a*, 18*a*) will be described below.

The P terminal 16, the N terminal 17, and the M terminal 18 constitute a metal wiring board through which a main current flows. The P terminal 16, the N terminal 17, and the M terminal 18 constitute the main terminal connectable to the external conductor, and one end of each of the P terminal 16, the N terminal 17, and the M terminal 18 is bonded to the predetermined circuit board 22 in the insulating substrate 6 with the bonding material S interposed therebetween.

Each of the terminals is formed of a metal material such as a copper material, a copper alloy-based material, an aluminum alloy-based material, or an iron alloy-based material, for example. A shape, an arrangement portion, and the number of arrangements, for example, of each of the terminals are not limited to the foregoing, but are appropriately changeable.

The control terminal 19 is provided in the wall section 25 on the positive side in the Y-direction. Ten control terminals 19, for example, are arranged for each of the unit modules 2. More specifically, in the one unit module 2, the ten control terminals, i.e., the five control terminals 19 and the five control terminals 19 are arranged with the M terminal 18 sandwiched therebetween in the left-right direction (X-direction). The ten control terminals 19 are arranged along the outer periphery of the opening section 4*a*.

A pair of pillar sections 25*a* vertically protruding in the Z-direction from an upper surface of the wall section along the opening section 4*a* is formed at an edge of the wall section 25. The pair of pillar sections 25*a* is arranged such that the M terminal 18 is sandwiched therebetween. A stepped section 25*b* lowered by one step from the upper surface of the wall section 25 is formed along the opening section 4*a* on the inner side (on the negative side in the Y-direction) of each of the pillar sections 25*a*. The stepped sections 25*b* are also arranged in a pair for each of the unit modules 2 such that the M terminal 18 is sandwiched therebetween in the left-right direction (X-direction).

Each of the control terminals 19 is formed of a metal material such as a copper material, a copper alloy-based material, an aluminum alloy-based material, or an iron alloy-based material, for example. The control terminal 19 is integrally molded (insert-molded) to be embedded in the case member 4. The five control terminals 19 are embedded into the stepped section 25*b* corresponding to one pillar section 25*a*.

Each of the control terminals 19 includes an inner terminal section 19*a* to be connected to the inner semiconductor device 7 and an outer terminal section 19*b* for external connection. An upper surface of the inner terminal section 19*a* is a connection portion (bonding point) of a wiring member W (a bonding wire). The inner terminal section 19*a* is connected to the upper surface electrode of the semiconductor device 7 via the wiring member W.

The case member 4 has a plurality of through holes 29 formed along its outer peripheral edge. Each of the through holes 29 is a hole into which a screw (not illustrated) for fixing the semiconductor apparatus 1 is to be inserted. The through hole 29 penetrates the case member 4 up to the base plate 8 in the cooler 3.

Resin for the case member 4 can be selected from insulating resin such as polybutylene terephthalate (PBT), polybutyl acrylate (PBA), polyamide (PA), acrylonitrile-butadiene-styrene (ABS), liquid crystal polymer (LCP), polyetheretherketone (PEEK), polybutylene succinate (PBS), urethane, and silicon in addition to polyphenylene sulfide (PPS). Resin to be selected may be a mixture of two or more types of resin. A filler (e.g., a glass filler) for improving strength and/or functionality may be contained in resin.

An internal space to be defined by the frame-shaped case member 4 is filled with the sealing resin 5. The insulating substrate 6 and the semiconductor device 7 mounted thereon are sealed into the above-described space with the sealing resin 5. The case member 4 defines a space that houses the plurality of unit modules 2 (the insulating substrates 6 and the semiconductor devices 7) and the sealing resin 5.

The sealing resin 5 is composed of thermosetting resin. The sealing resin 5 preferably includes at least one of epoxy, silicon, urethane, polyimide, polyamide, and polyamide-imide. Epoxy resin in which a filler is mixed, for example, is preferable for the sealing resin 5 in terms of insulation, heat resistance, and heat dissipation.

FIG. 3 illustrates an example of a circuit configuration illustrating an applied example of the semiconductor apparatus 1. In FIG. 3, the same components as the components illustrated in FIG. 1 and FIG. 2 are respectively assigned the same reference numerals, and description thereof is omitted. The semiconductor apparatus 1 illustrated in FIG. 3 is applied as an inverter that converts direct current power to be supplied from a power supply PS into alternating current power and drives an electric motor EM.

That is, each of the three unit modules 2 illustrated in FIG. 3 includes switches SW1 to SW6 as the plurality of semiconductor devices 7. Each of the switches SW1 to SW6 is an insulated gate bipolar transistor (IGBT), for example. Each of the switches SW1, SW3, and SW5 has its collector terminal connected to a positive electrode terminal of the power supply PS via one terminal of a capacitor C, and each of the switches SW2, SW4, and SW6 has its emitter terminal connected to a negative electrode terminal of the power supply PS via the other terminal of the capacitor C. A node between an emitter terminal of the switch SW1 and a collector terminal of the switch SW2 is connected to a U-phase input terminal of an electric motor EM, a node between an emitter terminal of the switch SW3 and a collector terminal of the switch SW4 is connected to a V-phase input terminal of the electric motor EM, and a node between an emitter terminal of the switch SW5 and a collector terminal of the switch SW6 is connected to a W-phase input terminal of the electric motor EM. A gate terminal of the switch SW1, a gate terminal of the switch SW2, a gate terminal of the switch SW3, a gate terminal of the switch SW4, a gate terminal of the switch SW5, and a gate terminal of the switch SW6 are respectively connected to a control unit Cnt provided outside the semiconductor apparatus 1.

A diode may be connected in reverse parallel to each of the switches SW1 to SW6 (here, reverse parallel connection means connecting an anode of the diode to an emitter of the switch and connecting a cathode of the diode to a collector of the switch). Each of the switches SW1 to SW6 may be composed of a metal oxide semiconductor field effect transistor (MOSFET) or the like.

The capacitor C smooths a voltage to be outputted to the unit modules 2 from the power supply PS.

The control unit Cnt turns on or off each of the switches SW1 to SW6. When each of the switches SW1 to SW6 is turned on or off, a DC voltage to be outputted from the power supply PS is converted into three AC voltages that differ in phase by 120 degrees from each other. When the AC voltages are respectively applied to the U-phase input terminal, the V-phase input terminal, and the W-phase input terminal of the electric motor EM, the electric motor EM is driven.

Subsequently, details of a terminal structure (the fastening sections 16a, 17a, 18a) for fastening the P terminal 16, the N terminal 17, and the M terminal 18 in the semiconductor apparatus 1 to the external conductor will be described. In the following description, the P terminal 16, the N terminal 17, and the M terminal 18 are generically referred to as a main terminal 35 for external connection. Respective fastening sections 40, 50, 60, and in four embodiments, described below, are applicable to any one of the fastening section 16a in the P terminal 16, the fastening section 17a in the N terminal 17, and the fastening section 18a in the M terminal 18.

Any one of the fastening sections 40, 50, 60, and 70 in the embodiments is composed of one plate-shaped body made of metal, and has a structure which surrounds and holds the nut 30. In each of the fastening sections 40, 50, 60, and 70 in the embodiments, the X-direction is a width direction of the plate-shaped body, the Y-direction is a longitudinal direction of the plate-shaped body, and the Z-direction is a thickness direction of the nut 30 (an axial direction of a screw hole 30a).

The nut 30 is a hexagonal nut, and has six side surfaces 30b constituting an outer surface of the screw hole 30a, six ridge line sections 30c as boundaries among the side surfaces 30b, and an upper surface 30d and a lower surface 30e as both end surfaces in the thickness direction.

FIG. 4 to FIG. 7 each illustrate a fastening section according to a first embodiment in a main terminal 35. The fastening section 40 includes an upper plate section 41, a lower plate section 42, a connection plate section 43, and a terminal section 44. The upper plate section 41 is a plate section extending in the Y-direction from respective plate-shaped sections 16b, 17b, 18b in a P terminal 16, an N terminal 17, and an M terminal 18.

In the terminal structure according to the present embodiment, the upper plate section 41 and the lower plate section 42 constitute a pair of plate sections between which a nut 30 can be sandwiched from both sides in the thickness direction. The lower plate section 42 is a first plate section, and the upper plate section 41 is a second plate section. The upper plate section 41 and the lower plate section 42 are each a rectangular flat plate portion having extensions in the X-direction and the Y-direction, and are arranged to be spaced apart from and substantially parallel to each other in the Z-direction. The upper plate section 41 and the lower plate section 42 are in an overlapping relationship in a planar view (see an arrow A view in FIG. 5). The upper plate section 41 has a through hole 32 formed therein, and the lower plate section 42 has a through hole 33 formed therein. The through hole 32 and the through hole 33 are both circular holes penetrating the upper plate section 41 and the lower plate section 42 in the Z-direction (a thickness direction of the upper plate section 41 and the lower plate section 42), and has a larger diameter than that of a screw hole 30a in the nut 30.

The connection plate section 43 is a flat plate portion having extensions in the X-direction and the Z-direction, and extends in the Z-direction to connect one end portion in the Y-direction of the upper plate section 41 and one end portion in the Y-direction of the lower plate section 42 to each other. The connection plate section 43 has a fitting hole 43a penetrating therethrough in the Y-direction (a thickness direction of the connection plate section 43) formed at its center in the X-direction. The fitting hole 43a is a rectangular hole surrounded by a pair of sides extending in the X-direction and a pair of sides extending in the Z-direction.

The terminal section 44 protrudes in the Z-direction toward the upper plate section 41 from the other end portion in the Y-direction of the lower plate section 42 (an end portion on the opposite side to the side to be connected to the connection plate section 43). More specifically, a pair of upstanding wall sections 45 is provided on both sides in the X-direction, and a notch section 45a penetrating the pair of upstanding wall sections 45 in the Y-direction is formed between the pair of upstanding wall sections 45. Each of the upstanding wall sections 45 is a flat plate portion substantially parallel to the connection plate section 43, and is arranged to oppose the connection plate section 43 in the Y-direction. The fitting hole 43a and the notch section 45a have substantially the same widths in the X-direction.

In the fastening section 40, a nut housing section is formed by the upper plate section 41 and the lower plate section 42 substantially parallel to each other and the connection plate section 43 and the terminal section 44 (the upstanding wall sections 45) substantially perpendicular to the upper plate section 41 and the lower plate section 42. The nut housing section in the fastening section 40 is closed by the upper plate section 41 and the lower plate section 42 on both sides in the Z-direction, and is closed by the connection plate section 43 and the terminal section 44 (the upstanding wall sections 45) on both sides in the Y-direction.

The nut 30 is housed in the nut housing section in the fastening section 40. In the nut 30 in the nut housing section, an upper surface 30*d* contacts the upper plate section 41, and a lower surface 30*e* contacts the lower plate section 42. The nut 30 is sandwiched by the upper plate section 41 and the lower plate section 42 to regulate movement of the nut 30 in the Z-direction. The nut 30 is sandwiched by the connection plate section 43 and the terminal section 44 (the upstanding wall sections 45) to regulate movement of the nut 30 in the Y-direction. Although the nut housing section is opened toward both sides in the X-direction, the nut 30 is fitted into the fitting hole 43*a* and the notch section 45*a*, to regulate movement of the nut 30 in the X-direction.

Figure 5:
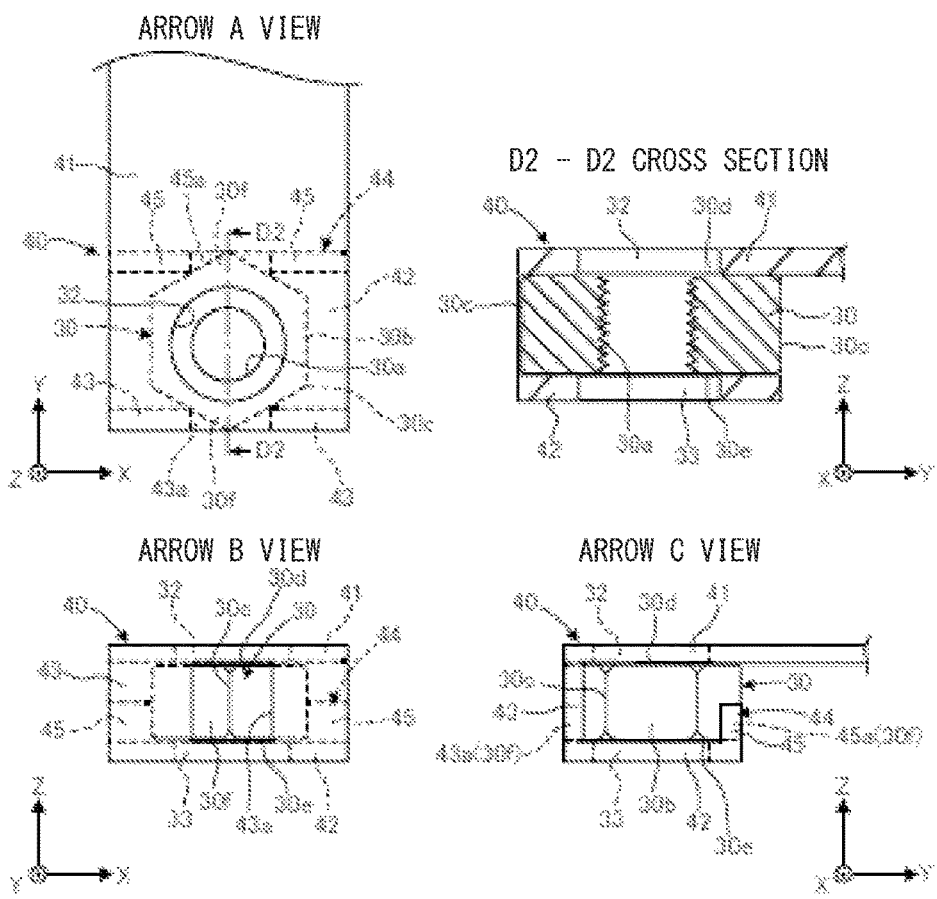
FIG. 5 is a diagram illustrating the fastening section according to the first embodiment in a planar view, a front view, a side view, and a sectional view.

More specifically, as illustrated in an arrow A view in FIG. 5, the nut 30 is arranged in the nut housing section by making the pair of side surfaces 30*b* positioned on both sides with the screw hole 30*a* sandwiched therebetween parallel to the Y-direction. As a result, a pair of corner sections 30*f* (corner sections each constituted by a ridge line section 30*c* and respective parts of the pair of side surfaces 30*b* on both sides thereof) is oriented to protrude toward both sides in the Y-direction, and one of the corner sections 30*f* and the other corner section 30*f* are respectively inserted into the fitting hole 43*a* and the notch section 45*a*. The pair of side surfaces 30*b* in the corner section 30*f* to be inserted into the fitting hole 43*a* contacts an inner edge portion in the X-direction of the fitting hole 43*a*. The pair of side surfaces 30*b* in the corner section 30*f* to be inserted into the notch section 45*a* contacts an inner edge portion in the X-direction of the notch section 45*a*. The side surfaces that contact each of the inner edge portion of the fitting hole 43*a* and the inner edge portion of the notch section 45*a* are each a surface intersecting the X-direction and the Y-direction. Accordingly, movements of the nut 30 in the X-direction and the Y-direction are regulated by the contact.

Rotation of the nut 30 held in the nut housing section in the fastening section 40 is regulated by respectively fitting the corner sections 30*f* in the fitting hole 43*a* and the notch section 45*a*.

Thus, in the fastening section 40, the nut 30 is held while being sandwiched in the Z-direction by the upper plate section 41 and the lower plate section 42, and the connection plate section 43 and the terminal section 44 further respectively include holding sections (the fitting hole 43*a* and the notch section 45*a*) that regulate rotation of the nut 30 and movements of the nut 30 in directions (the Y-direction and the X-direction) intersecting the Z-direction.

A state where the fastening section 40 having the above-described configuration is applied as the fastening section 17*a* in the semiconductor apparatus 1 is illustrated in FIG. 2. The fastening section 40 is inserted into the recess 27 having a rectangular shape in a planar view, and movements of the fastening section 40 in the X-direction and the Y-direction are regulated by an inner surface of the recess 27. The lower plate section 42 is supported on a bottom surface of the recess 27. The upper plate section 41 is positioned along an upper surface of the wall section 24.

In this state, the male screw section 31*a* in the fastening screw 31 is inserted into the through hole 36*a* in the external conductor 36 and the through hole 32 in the upper plate section 41, and is threaded into the screw hole in the nut 30. The nut 30 is held in the nut housing section in the fastening section 40 (17*a*) with rotation thereof regulated, and the fastening section 40 is inserted into the recess 27 with rotation thereof regulated. Accordingly, when the fastening screw 31 is rotated, the nut 30 remains at a predetermined position in the recess 27 without rotating, and the male screw section 31*a* progresses in the Z-direction while rotating. When the fastening screw 31 is rotated until the external conductor 36 is sandwiched between a flange 31*b* in the fastening screw 31 and an upper surface of the upper plate section 41, to further apply a predetermined amount or more of fastening torque, the external conductor 36 and the fastening section are fastened to each other. In this state, the male screw section 31*a* in the fastening screw 31 penetrates through the through hole 33 in the lower plate section 42 and protrudes more downward than the lower plate section 42, to enter a stepped recess 27*a* formed on the bottom surface of the recess 27.

Even when the fastening section 40 is applied to the fastening section 16*a* and the fastening section 18*a*, illustration of which is omitted, a similar structure to that illustrated in FIG. 2 is formed so that the external conductor 36 is fastened to the fastening section 40 using the fastening screw 31.

Figure 4:
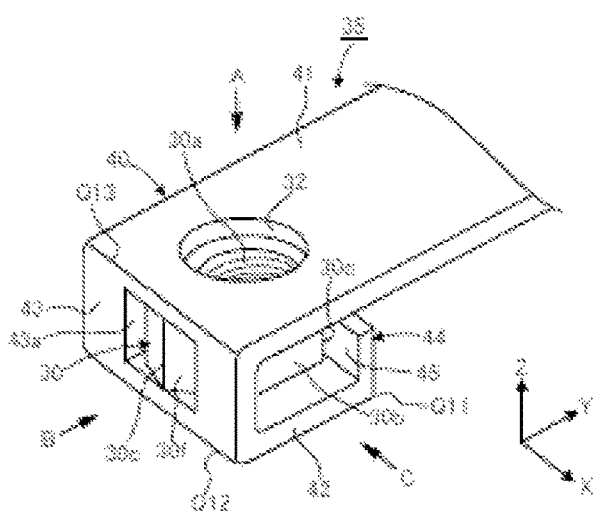
FIG. 4 is a perspective view of a fastening section in a terminal structure according to a first embodiment.
Figure 6:
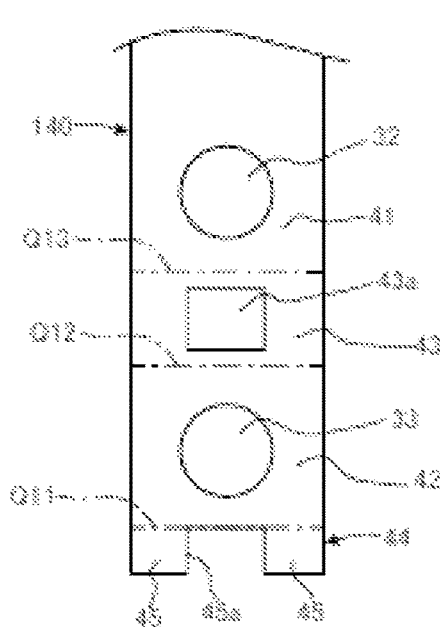
FIG. 6 is a development view of the fastening section according to the first embodiment.

As illustrated in FIG. 4, the fastening section 40 is configured by bending at substantially a right angle at each of a boundary section Q11 between the terminal section 44 (the upstanding wall section 45) and the lower plate section 42, a boundary section Q12 between the lower plate section 42 and the connection plate section 43, and a boundary section Q13 between the connection plate section 43 and the upper plate section 41. FIG. 6 illustrates a plate-shaped body 140 having a developed shape that has not yet been bent at each of the boundary sections Q11, Q12, and Q13. In FIG. 6, a portion to be each of the boundary sections Q11, Q12, and Q13 after the plate-shaped body 140 is bent is virtually indicated by a one-dot and dash line.

A method for manufacturing a fastening section 40 will be described with reference to FIG. 6 and FIG. 7. First, as illustrated in FIG. 6, one plate-shaped body 140 made of metal is subjected to press working (punching processing), for example, to form sites respectively corresponding to a through hole 32, a through hole 33, a fitting hole 43*sa*, and a notch section 45*a*.

Figure 7:
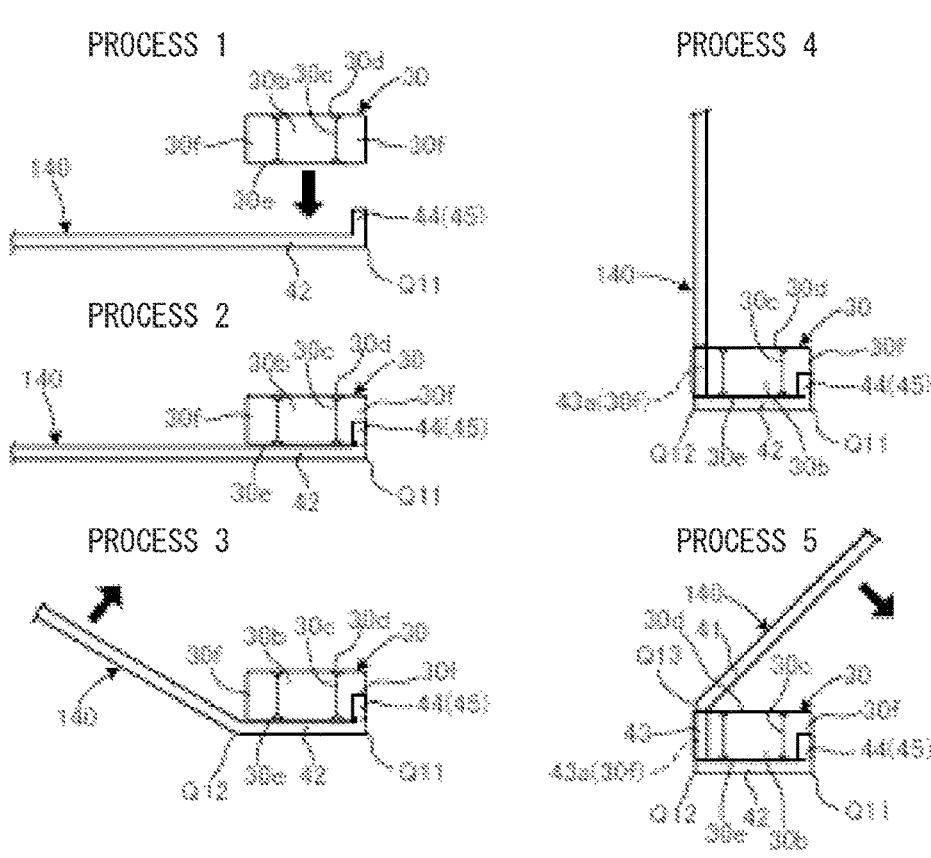
FIG. 7 is a diagram illustrating processes for forming the fastening section according to the first embodiment.

Then, as illustrated in a process 1 in FIG. 7, the plate-shaped body 140 is subjected to bending processing at substantially a right angle at a portion of a boundary section Q11, to form a pair of upstanding wall sections 45. Then, in a process 2, a lower surface 30*e* of a nut 30 is placed on a lower plate section 42, to fit one of corner sections 30*f* in the Y-direction into the notch section 45*a*. Then, in a process 3, the plate-shaped body 140 is subjected to bending processing at a portion of a boundary section Q12. As illustrated in a process 4, when the portion of the boundary section Q12 is bent at substantially a right angle, the other corner section 30*f* in the Y-direction is fitted into the fitting hole 43*a*. Then, in a process 5, the plate-shaped body 140 is subjected to bending processing at a portion of the boundary section Q13. When the portion of the boundary section Q13 is bent at substantially a right angle, there occurs a state where an upper surface 30*d* of the nut 30 is covered with an upper plate section 41, thereby completing the fastening section 40.

According to the above-described manufacturing method, when the nut 30 is placed on the plate-shaped body 140, to sequentially bend the plate-shaped body 140 at its portions in the longitudinal direction, the fastening section 40 can be formed. The fastening section 40 is manufactured by pre-processing (press working, etc.) for forming the through hole 32, the through hole 33, and the notch section in the plate-shaped body 140 and bending processing for bending the plate-shaped body 140 at the plurality of boundary sections Q11, Q12, Q13 all extending in the same direction (the X-direction). Accordingly, the fastening section 40 can be manufactured with efficiency and at low cost without requiring a complicated work process.

In the fastening section 40, the nut 30 is inserted at least before the nut housing section is completely closed by subjecting the boundary section Q13 to bending processing. Further, in the fastening section 40, the corner section 30*f* in the nut 30 is fitted into the fitting hole 43*a* in the connection plate section 43. Accordingly, bending processing in the boundary section Q12 is preferably performed after the nut 30 is previously placed on the lower plate section 42, as illustrated in the process 2 to the process 4 in FIG. 7.

The method for manufacturing the fastening section 40 is not limited to the foregoing. For example, the notch section 45*a* may be fitted into the corner section 30*f* by placing the nut 30 on the lower plate section 42 in a completely flat state where the plate-shaped body 140 has not yet been bent in the boundary section Q11 and then bending the plate-shaped body 140 at the boundary section Q11 to form the upstanding wall sections 45.

The fastening section 40 described above makes it possible to simplify the structure of the semiconductor apparatus 1 without the need to provide the case member 4 or the like in the semiconductor apparatus 1 with holders for nut holding by incorporating the nut 30 into the distal end side of the main terminal 35. The nut housing section is formed by one component (one plate-shaped body 140) constituting the main terminal 35, and the nut 30 housed in the nut housing section is held in all the Z-direction, the Y-direction, and the X-direction to regulate movement of the nut 30 and regulate rotation of the nut 30. Therefore, a terminal structure into which the nut 30 is incorporated can be obtained by a small number of components.

Particularly, the upper surface 30*d* and the lower surface 30*e* of the nut 30 are sandwiched between and held by the upper plate section 41 and the lower plate section 42 each having a large area, which are excellent in holding strength and holding stability for the nut 30.

Rotation of the nut 30 and movements of the nut 30 in directions (the X-direction and the Y-direction) intersecting to the thickness direction are regulated using the holding sections (the fitting hole 43*a* and the notch section 45*a*) respectively provided in the connection plate section 43 and the terminal section 44 that are positioned along the side surfaces 30*b* of the nut 30. A torque to be exerted on the nut 30 can be reliably received with a simple structure without providing an additional separate component.

Therefore, in the case member 4 in the semiconductor apparatus 1, special enhancement for receiving a torque is not required for the respective peripheries of the recesses 26, 27, and 28 where the fastening section 40 is arranged to reduce the wall thickness of the case member 4, thereby making it possible to miniaturize the semiconductor apparatus 1.

A state where the nut 30 is mounted on the nut housing section can be visually confirmed from outside through the fitting hole 43*a* provided in the connection plate section 43, thereby making it possible to prevent a malfunction such as forgetting to insert the nut 30.

When the fastening section 40 is manufactured, a shape of each portion in the fastening section 40 is obtained by subjecting the plate-shaped body 140 to bending processing along the boundary sections Q11, Q12, Q13 all extending in the X-direction. Therefore, an apparatus or a tool for performing the bending processing along the boundary sections Q11, Q12, Q13 is easily made to be common. This can result in an improvement in productivity and a reduction in manufacturing cost.

All the through hole 32, the through hole 33, the fitting hole 43*a*, and the notch section 45*a* in the fastening section 40 are respectively obtained as portions penetrating through the fastening section 40 in a plate thickness direction in a flat base plate, i.e., the plate-shaped body 140 that has not yet been subjected to bending processing. Accordingly, the portions can be efficiently formed by one or a small number of times of press working. This can result in an improvement in productivity and a reduction in manufacturing cost.

FIG. 8 to FIG. 11 each illustrate a fastening section 50 according to a second embodiment in a main terminal 35. The fastening section 50 includes an upper plate section 51, a lower plate section 52, a connection plate section 53, and a terminal section 54. The upper plate section 51 and the lower plate section 52 respectively have similar configurations to those of the upper plate section 41 and the lower plate section 42 in the fastening section 40 according to the first embodiment, and respectively have a through hole 32 and a through hole 33 penetrating therethrough in the Z-direction formed therein. The upper plate section 51 and the lower plate section 52 constitute a pair of plate sections between which a nut 30 can be sandwiched from both sides in the thickness direction, and the lower plate section 52 is a first plate section and the upper plate section 51 is a second plate section.

The connection plate section 53 is a flat plate portion having extensions in the X-direction and the Z-direction, and extends in the Z-direction to connect one end portion in the Y-direction of the upper plate section 51 and one end portion in the Y-direction of the lower plate section 52 to each other. A hole or a recess is not formed in the connection plate section 53, unlike the connection plate section 43 in the fastening section 40 according to the first embodiment.

The terminal section 54 protrudes in the Z-direction toward the upper plate section 51 from the other end portion in the Y-direction of the lower plate section 52 (an end portion on the opposite side to the side to be connected to the connection plate section 53). More specifically, in the terminal section 54, a lower end portion of an upstanding wall section 55 as a flat plate portion having extensions in the X-direction and the Z-direction is connected to the lower plate section 52, and there is provided a holding plate section 56 protruding in the Y-direction toward the connection plate section 53 from an upper end portion of the upstanding wall section 55. The holding plate section 56 is a flat plate portion having extensions in the X-direction and the Y-direction, like the upper plate section 51 and the lower plate section 52.

Figure 9:
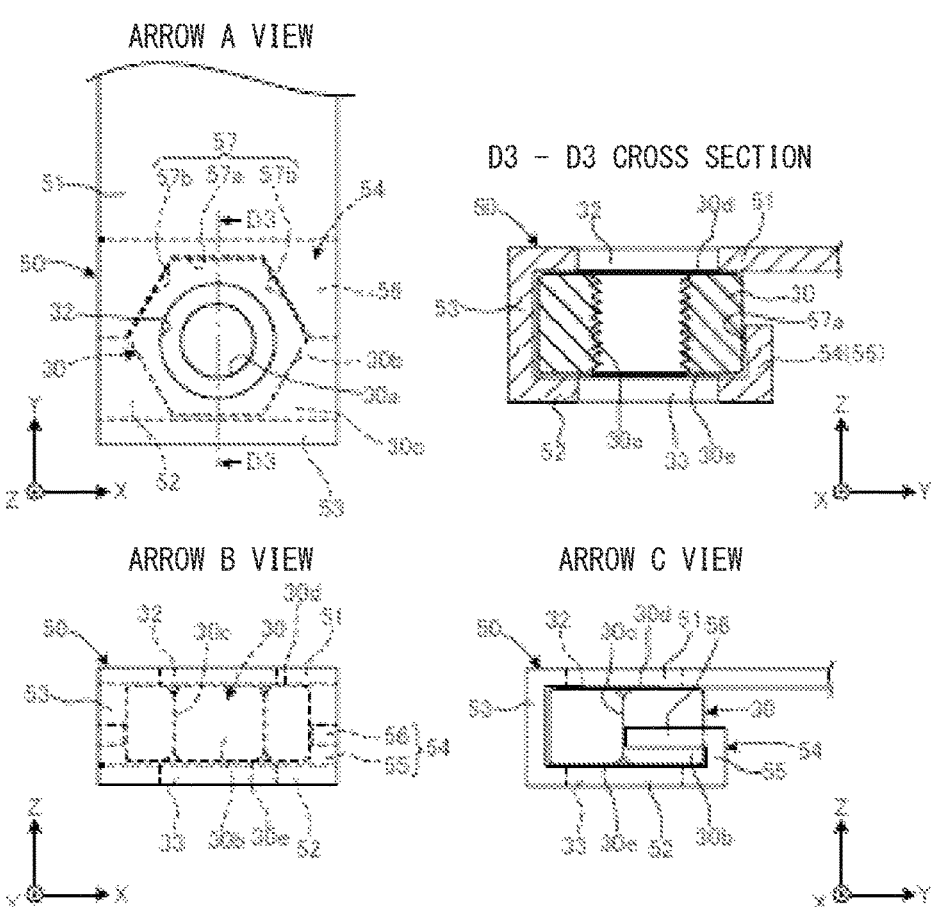
FIG. 9 is a diagram illustrating the fastening section according to the second embodiment in a planar view, a front view, a side view, and a sectional view.

As illustrated in an arrow A view in FIG. 9, the holding plate section 56 has a fitting recess 57 on the distal end side oriented toward the connection plate section 53. The fitting recess 57 includes a bottom surface section 57*a* positioned at the center in the X-direction and extending in the X-direction and a pair of tapered surface sections 57*b* respectively positioned on both sides of the bottom surface section 57*a* and each inclined in the X-direction and the Y-direction. A spacing in the X-direction between the pair of tapered surface sections 57*b* is increased as a distance in the Y-direction of the pair of tapered surface sections 57*b* from the bottom surface section 57*a* increases. Three side surfaces 30*b* of the nut 30 can be respectively fitted into the bottom surface section 57*a* and the pair of tapered surface sections 57*b* in the fitting recess 57. The lengths of the bottom surface section 57a and the tapered surface sections 57b in a planar view respectively correspond to the lengths of the side surfaces 30b of the nut 30.

In the fastening section 50, a nut housing section is formed by the upper plate section 51 and the lower plate section 52 substantially parallel to each other and the connection plate section 53 and the upstanding wall section substantially perpendicular to the upper plate section 51 and the lower plate section 52. The nut housing section in the fastening section 50 is closed by the upper plate section 51 and the lower plate section 52 on both sides in the Z-direction, and is closed by the connection plate section 53 and the upstanding wall section 55 on both sides in the Y-direction. The holding plate section 56 protrudes from the upstanding wall section 55 to enter the nut housing section.

The nut 30 is housed in the nut housing section in the fastening section 50. In the nut 30 in the nut housing section, an upper surface 30d and a lower surface 30e are sandwiched by the upper plate section 51 and the lower plate section 52, to regulate movement of the nut 30 in the Z-direction, and the plurality of side surfaces 30b are sandwiched by the connection plate section 53 and the terminal section 54 (the holding plate section 56), to regulate movement of the nut 30 in the Y-direction. Although the nut housing section is opened toward both sides in the X-direction, the nut 30 is fitted into the fitting recess 57 in the holding plate section 56, to regulate movement of the nut 30 in the X-direction.

More specifically, as illustrated in an arrow A view in FIG. 9, the nut 30 is arranged in the nut housing section by making the pair of side surfaces 30b positioned on both sides with a screw hole 30a sandwiched therebetween parallel to the X-direction. As a result, the three side surfaces 30b among the six side surfaces 30b of the nut 30 respectively enter fitting states where they contact the bottom surface section 57a and the pair of tapered surface sections 57b in the fitting recess 57. The side surfaces 30b on the opposite side to the side that contacts the bottom surface section 57a enter states where they contact the connection plate section 53. Therefore, the nut 30 is sandwiched between the connection plate section 53 and the surface sections (the bottom surface section 57a and the pair of tapered surface sections 57b) in the fitting recess 57, to regulate movement of the nut 30 in the Y-direction. The pair of tapered surface sections 57b is each a surface inclined in the X-direction and the Y-direction. Accordingly, the pair of side surfaces 30b is brought into contact with the pair of tapered surface sections 57b, to regulate movement of the nut 30 in the X-direction.

The nut 30 held in the nut housing section in the fastening section 50 is fitted into the fitting recess 57, to regulate rotation of the nut 30.

Thus, in the fastening section 50, the nut 30 is held while being sandwiched in the Z-direction by the upper plate section 51 and the lower plate section 52, and the connection plate section 53 and the terminal section 54 further respectively include holding sections (a surface on the side, oriented toward the terminal section 54, of the connection plate section 53 and the fitting recess 57) that regulate rotation of the nut 30 and movements of the nut 30 in directions (the Y-direction and the X-direction) intersecting the Z-direction.

The fastening section 50 can be applied as fastening sections 16a, 17a, 18a in a semiconductor apparatus 1, like the above-described fastening section 40. When a fastening screw 31 is threaded into the nut 30 held by the fastening section 50, an external conductor 36 can be fastened to the fastening section 50.

Figure 8:
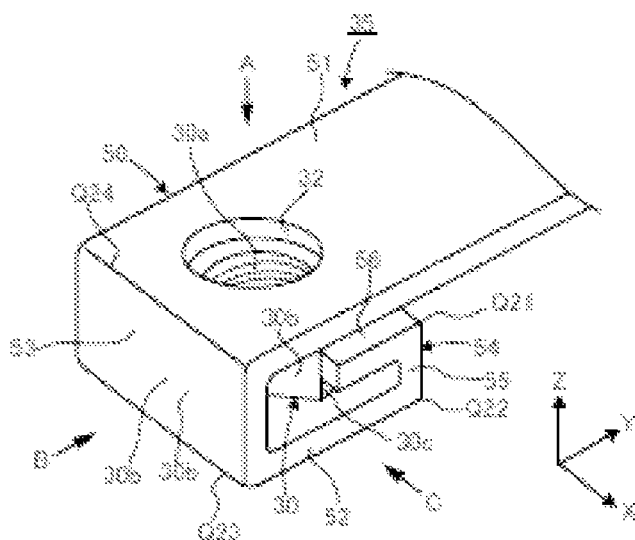
FIG. 8 is a perspective view of a fastening section in a terminal structure according to a second embodiment.
Figure 10:
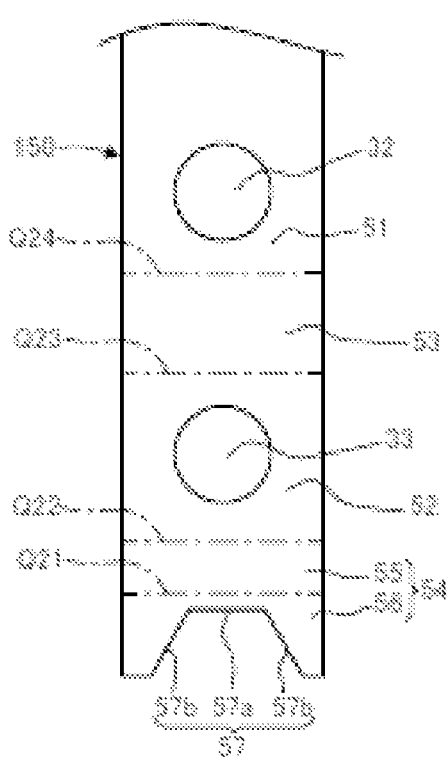
FIG. 10 is a development view of the fastening section according to the second embodiment.

As illustrated in FIG. 8, the fastening section 50 is configured by bending at substantially a right angle at each of a boundary section Q21 between the holding plate sections 56 and the upstanding wall section 55, a boundary section Q22 between the upstanding wall section 55 and the lower plate section 52, a boundary section Q23 between the lower plate section 52 and the connection plate section 53, and a boundary section Q24 between the connection plate section 53 and the upper plate section 51. FIG. 10 illustrates a plate-shaped body 150 having a developed shape that has not yet been bent in each of the boundary sections Q21, Q22, Q23, Q24. In FIG. 10, a portion to be each of the boundary sections Q21, Q22, Q23, Q24 after the plate-shaped body 150 is bent is virtually indicated by a one-dot and dash line.

A method for manufacturing the fastening section 50 will be described with reference to FIG. 10 and FIG. 11. First, as illustrated in FIG. 10, one plate-shaped body 150 made of metal is subjected to press working (punching processing), for example, to form sites respectively corresponding to a through hole 32, a through hole 33, and a fitting recess 57.

Figure 11:
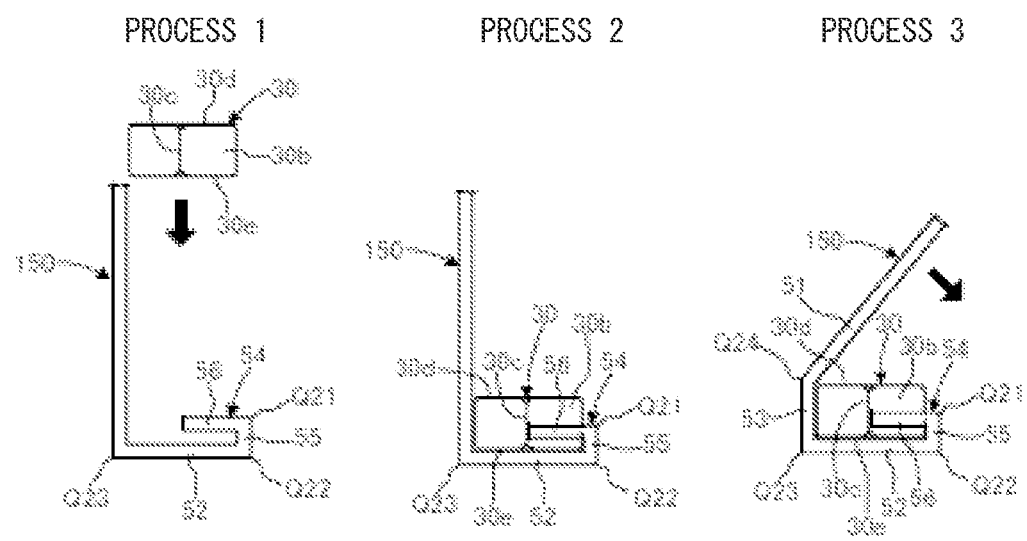
FIG. 11 is a diagram illustrating processes for forming the fastening section according to the second embodiment.

Then, as illustrated in a process 1 in FIG. 11, the plate-shaped body 150 is subjected to bending processing at substantially a right angle at each of portions of a boundary section Q21 and a boundary section Q22, to form an upstanding wall section 55 and a holding plate section 56. The plate-shaped body 150 is subjected to bending processing at substantially a right angle at a portion of a boundary section Q23. Then, in a process 2, a lower surface 30e of a nut 30 is placed on a lower plate section 52, to fit three side surfaces 30b of the nut 30 into the fitting recess 57. Then, in a process 3, the plate-shaped body 150 is subjected to bending processing at a portion of a boundary section Q24. When the portion of the boundary section Q24 is bent at substantially a right angle, there occurs a state where an upper surface 30d of the nut 30 is covered with an upper plate section 51, thereby completing the fastening section 50.

According to the above-described manufacturing method, when the nut 30 is placed on the plate-shaped body 150, to sequentially bend the plate-shaped body 150 in each of its portions in the longitudinal direction, the fastening section 50 can be formed. The fastening section 50 is manufactured by pre-processing (press working, etc.) for forming the through hole 32, the through hole 33, and the fitting recess 57 in the plate-shaped body 150 and bending processing for bending the plate-shaped body 150 along the plurality of boundary sections (bending lines) Q21, Q22, Q23, Q24 that are parallel to one another, i.e., all extending in the same direction (the X-direction). Accordingly, the fastening section 50 can be manufactured with efficiency and at low cost without requiring a complicated work process.

The method for manufacturing the fastening section 50 is not limited to the foregoing. For example, the fitting recess 57 may be fitted into the side surface 30b by placing the nut 30 on the lower plate section 52 in a completely flat state where the plate-shaped body 150 has not yet been bent at the boundary section Q21 and the boundary section Q22 and then bending the plate-shaped body 150 at the boundary section Q21 and the boundary section Q22 to form the upstanding wall section 55 and the holding plate section 56.

In the fastening section 50, the nut 30 is inserted at least before the nut housing section is completely closed by subjecting the boundary section Q24 to bending processing. Further, in the fastening section 50, the connection plate section 53 does not have a hole or a recess to be fitted into the nut 30. Accordingly, a timing at which bending processing is performed at the boundary section Q23 has a degree of freedom. For example, a state illustrated in the process 2 in FIG. 11 may occur by placing the nut 30 on the lower plate section 52 in a stage where the plate-shaped body 150 has not yet been bent at the boundary section Q23 and then bending the plate-shaped body 150 at the boundary section Q23.

As a modification of a configuration of the fastening section 50, a fastening section 50 can also be configured such that a bottom surface section 57a in a fitting recess 57 does not contact side surfaces 30b of a nut 30. A pair of tapered surface sections 57b in the fitting recess 57 each has components in both the X-direction and the Y-direction. Thus, even a configuration in which the nut 30 does not contact the bottom surface section 57a makes it possible to regulate movement of the nut 30 in the Y-direction by contact with the pair of tapered surface sections 57b. That is, a function of regulating movements of the nut 30 in the X-direction and the Y-direction and a function of regulating rotation of the nut 30 can be aggregated on the tapered surface sections 57b in the fitting recess 57.

The fastening section 50 described above makes it possible to obtain a similar effect to that in the above-described fastening section 40. Further, the connection plate section 53 and the surfaces (the bottom surface section 57a and the pair of tapered surface sections 57b) of the fitting recess 57 respectively have lengths in which they can contact each of the side surfaces 30b of the nut along substantially the whole thereof in a planar view (see an arrow A view in FIG. 9). Thus, the area of a portion associated with regulation of rotation and regulation of movement of the nut 30 is increased, thereby obtaining an effect of preventing a stress from being locally concentrated.

Figure 12:
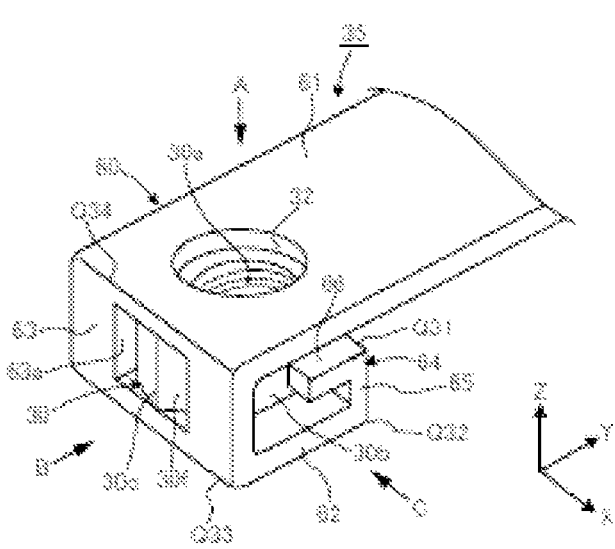
FIG. 12 is a perspective view of a fastening section in a terminal structure according to a third embodiment.
Figure 13:
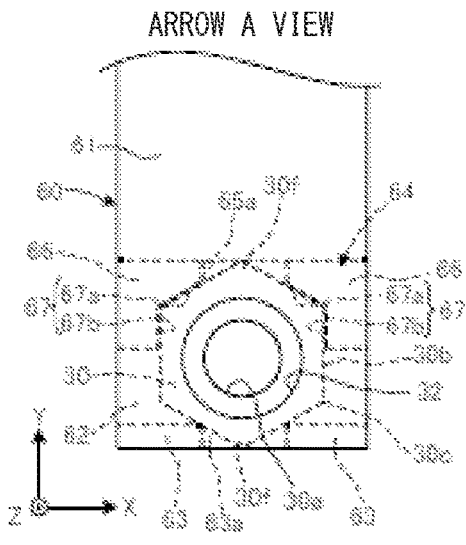
FIG. 13 is a diagram illustrating the fastening section according to the third embodiment in a planar view, a front view, and a side view.
Figure 13:
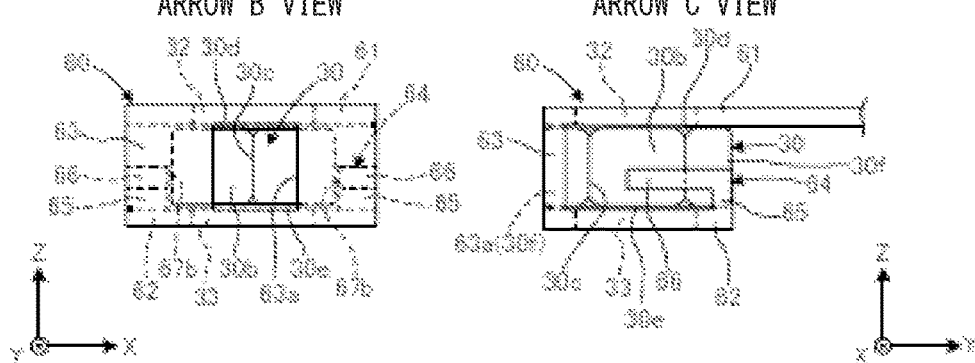
Figure 14:
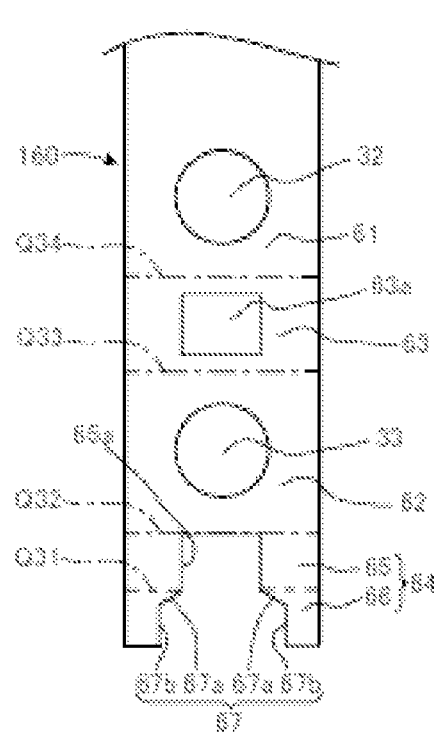
FIG. 14 is a development view of the fastening section according to the third embodiment.

FIG. 12 to FIG. 14 each illustrate a fastening section according to a third embodiment in a main terminal 35. The fastening section 60 includes an upper plate section 61, a lower plate section 62, a connection plate section 63, and a terminal section 64. The upper plate section 61 and the lower plate section 62 respectively have similar configurations to those of the upper plate section 41 and the lower plate section 42 in the fastening section 40 according to the first embodiment, and respectively have a through hole 32 and a through hole 33 penetrating therethrough in the Z-direction formed therein. The upper plate section 61 and the lower plate section 62 constitute a pair of plate sections between which a nut 30 can be sandwiched from both sides in the thickness direction, and the lower plate section 62 is a first plate section and the upper plate section 61 is a second plate section.

The connection plate section 63 has a similar configuration to that of the connection plate section 43 in the fastening section 40 according to the first embodiment, and has a fitting hole 63a having a rectangular shape penetrating therethrough in the Y-direction formed therein.

The terminal section 64 has a configuration similar to that of the terminal section 54 in the fastening section 50 according to the second embodiment, and protrudes in the Z-direction toward the upper plate section 61 from an end portion in the Y-direction of the lower plate section 62 (an end portion on the opposite side to the side to be connected to the connection plate section 63). More specifically, in the terminal section 64, respective lower end portions of a pair of upstanding wall sections 65 as flat plate portions each having extensions in the X-direction and the Z-direction are connected to the lower plate section 62, and there is provided a pair of holding plate sections 66 protruding in the Y-direction toward the connection plate section 63 from respective upper end portions of the upstanding wall sections 65. Each of the holding plate sections 66 is a flat plate portion having extensions in the X-direction and the Y-direction, like the upper plate section 61 and the lower plate section 62. The pair of upstanding wall sections 65 has a notch section 65a penetrating therethrough in the Y-direction formed therebetween.

As illustrated in an arrow A view in FIG. 13, the pair of holding plate sections 66 respectively have fitting recesses 67 on the distal end side oriented toward the connection plate section 63. The fitting recesses 67 respectively include a pair of tapered surface sections 67a each formed continuously from the notch section 65a and inclined in the X-direction and the Y-direction and a pair of side surface sections 67b extending in the Y-direction toward the distal end side of the holding plate sections 66 from the tapered surface sections 67a. A spacing in the X-direction between the pair of tapered surface sections 67a is increased as a distance in the Y-direction of the pair of tapered surface sections 67a from the notch section 65a increases. Two side surfaces 30b that are adjacent to each other with a ridge line section 30c sandwiched therebetween among six side surfaces 30b of the nut 30 can contact the pair of tapered surface sections 67a. The pair of side surfaces 30b parallel to each other positioned on both sides with a screw hole 30a sandwiched therebetween among the six side surfaces 30b of the nut 30 can contact the pair of side surface sections 67b. That is, the continuous four side surfaces 30b of the nut 30 can be fitted into the fitting recesses 67.

In the fastening section 60, a nut housing section is formed by the upper plate section 61 and the lower plate section 62 substantially parallel to each other and the connection plate section 63 and the pair of upstanding wall sections 65 substantially perpendicular to the upper plate section 61 and the lower plate section 62. The nut housing section in the fastening section 60 is closed by the upper plate section 61 and the lower plate section 62 on both sides in the Z-direction, and is closed by the connection plate section 63 and the pair of upstanding wall sections on both sides in the Y-direction. The pair of holding plate sections 66 protrudes from the upstanding wall sections 65 to enter the nut housing section.

The nut 30 is housed in the nut housing section in the fastening section 60. In the nut 30 in the nut housing section, an upper surface 30d and a lower surface 30e are sandwiched by the upper plate section 61 and the lower plate section 62 to regulate movement of the nut 30 in the Z-direction, and the plurality of side surfaces 30b are sandwiched by the connection plate section 63 and the terminal section 64 (the pair of holding plate sections 66) to regulate movement of the nut 30 in the Y-direction. Although the nut housing section is opened toward both sides in the X-direction, the nut 30 is fitted into the fitting hole 63a in the connection plate section 63 and the fitting recesses 67 in the pair of holding plate sections 66, to regulate movement of the nut 30 in the X-direction.

More specifically, as illustrated in an arrow A view in FIG. 13, the nut 30 is arranged in the nut housing section by making the pair of side surfaces 30b positioned on both sides with the screw hole 30a sandwiched therebetween parallel to the Y-direction. As a result, a pair of corner sections 30f (a ridge line section 30c and respective parts of the pair of side surfaces 30b on both sides thereof) is oriented to protrude toward both sides in the Y-direction, and one of the corner sections 30f and the other corner section 30f are respectively inserted into the fitting hole 63a and the notch section 65a. The pair of side surfaces 30b constituting the corner section 30f to be inserted into the notch section 65a contacts the pair of tapered surface sections 67a in the fitting recess 67, and the pair of side surfaces 30b extending in the Y-direction contacts the pair of side surface sections 67b. As a result, there occurs a fitting state where four of the six side surfaces 30b of the nut 30 respectively contact the pair of tapered surface sections 67a and the pair of side surface sections 67b in the fitting recesses 67.

Therefore, the nut 30 is sandwiched between the connection plate section 63 (an inner edge portion of the fitting hole 63a) and the holding plate sections 66 (the pair of tapered surface sections 67a), to regulate movement of the nut 30 in the Y-direction. One of the corner sections 30f oriented in the Y-direction is fitted into the fitting hole 63a, and the pair of side surfaces 30b extending in the Y-direction is sandwiched between the pair of side surface sections 67b, to regulate movement of the nut 30 in the X-direction.

The nut 30 held in the nut housing section in the fastening section 60 is fitted into the fitting hole 63a and the fitting recesses 67, to regulate rotation of the nut 30.

Thus, in the fastening section 60, the nut 30 is held while being sandwiched in the Z-direction by the upper plate section 61 and the lower plate section 62, and the connection plate section 63 and the terminal section 64 further respectively include holding sections (the fitting hole 63a and the fitting recesses 67) that regulate rotation of the nut 30 and movements of the nut 30 in directions (the Y-direction and the X-direction) intersecting the Z-direction.

The fastening section 60 can be applied as fastening sections 16a, 17a, 18a in a semiconductor apparatus 1, like the above-described fastening section 40. When a fastening screw 31 is threaded into the nut 30 held by the fastening section 60, an external conductor 36 can be fastened to the fastening section 60.

As illustrated in FIG. 12, the fastening section 60 is configured by bending at substantially a right angle at each of a boundary section Q31 between the pair of upstanding wall sections 65 and the pair of holding plate sections 66, a boundary section Q32 between the pair of upstanding wall sections 65 and the lower plate section 62, a boundary section Q33 between the lower plate section 62 and the connection plate section 63, and a boundary section Q34 between the connection plate section 63 and the upper plate section 61. FIG. 14 illustrates a plate-shaped body 160 having a developed shape that has not yet been bent at each of the boundary sections Q31, Q32, Q33, Q34. In FIG. 14, a portion to be each of the boundary sections Q31, Q32, Q33, Q34 after the plate-shaped body 160 is bent is virtually indicated by a one-dot and dash line.

A method for manufacturing the fastening section 60 is basically similar to the method for manufacturing the fastening section 40 previously described, and thus will be simply described by omitting illustration thereof. First, one plate-shaped body 160 made of metal is subjected to press working (punching processing), for example, to form sites respectively corresponding to a through hole 32, a through hole 33, a fitting hole 63a, a notch section 65a, and a fitting recess 67.

Then, the plate-shaped body 160 is subjected to bending processing at substantially a right angle at each of portions of a boundary section Q31 and a boundary section Q32, to respectively form a pair of upstanding wall sections 65 and a pair of holding plate sections 66. Then, a lower surface 30e of a nut 30 is placed on a lower plate section 62, to insert one of corner sections 30f in the Y-direction into the notch section 65a and fit four side surfaces 30b in the nut 30 into the fitting recess 67. Then, the plate-shaped body 160 is subjected to bending processing at a portion of a boundary section Q33, to form a portion of a connection plate section 63 and fit the other corner section 30f in the Y-direction into the fitting hole 63a. Then, the plate-shaped body 160 is subjected to bending processing at a portion of a boundary section Q34, to cover an upper surface 30d of the nut 30 with an upper plate section 61. Accordingly, the fastening section 60 is completed. In the fastening section 60, the nut 30 is inserted at least before a nut housing section is completely closed by subjecting the boundary section Q34 to bending processing.

According to the above-described manufacturing method, when the nut 30 is placed on the plate-shaped body 160, to sequentially bend the plate-shaped body 160 in each of its portions in the longitudinal direction, the fastening section 60 can be formed. The fastening section 60 is manufactured by pre-processing (press working, etc.) for forming the through hole 32, the through hole 33, the fitting hole 63a, the notch section 65a, and the fitting recess 67 in the plate-shaped body 160 and bending processing for bending the plate-shaped body 160 at the plurality of boundary sections Q31, Q32, Q33, Q34 all extending in the same direction (the X-direction). Accordingly, the fastening section 60 can be manufactured with efficiency and at low cost without requiring a complicated work process.

The method for manufacturing the fastening section 60 is not limited to the foregoing. For example, the fitting recesses 67 may be fitted into the nut 30 by placing the nut 30 on the lower plate section 62 in a completely flat state where the plate-shaped body 160 has not yet been bent at the boundary section Q31 and the boundary section Q32 and then bending the plate-shaped body 160 at the boundary section Q31 and the boundary section Q32 to form the pair of upstanding wall sections 65 and the pair of holding plate sections 66.

The fastening section 60 described above makes it possible to obtain a similar effect to that in the above-described fastening section 40. Further, the fastening section 60 is high in load resistance because it has a structure in which all six side surfaces 30b in the nut 30 are fitted into the fitting hole 63a or the fitting recess 67, and firmly holds the nut 30, thereby making it possible to regulate rotation and movement of the nut 30.

FIG. 15 to FIG. 18 each illustrate a fastening section according to a fourth embodiment in a main terminal 35. The fastening section 70 includes an upper plate section 71, a lower plate section 72, an inclined connection plate section 73, and a bent section 74. The upper plate section 71 and the lower plate section 72 respectively have similar configurations to those of the upper plate section 41 and the lower plate section 42 in the fastening section 40 according to the first embodiment, and respectively have a through hole 32 and a through hole 33 penetrating therethrough in the Z-direction formed therein. The upper plate section 71 and the lower plate section 72 constitute a pair of plate sections between which a nut 30 can be sandwiched from both sides in the thickness direction.

The inclined connection plate section 73 is a flat plate portion the height in the Z-direction of which changes in the Y-direction and that obliquely extends to intersect the upper plate section 71 and the lower plate section 72 in the Z-direction. The inclined connection plate section 73 is connected to the upper plate section 71 and the lower plate section 72, respectively, at different positions in the Y-direction. More specifically, the inclined connection plate section 73 is connected to an end portion on the negative side in the Y-direction (or the positive side in the Y-direction) of the upper plate section 71 and is connected to an end portion on the positive side in the Y-direction (or the negative side in the Y-direction) of the lower plate section 72, and the upper plate section 71, the lower plate section 72, and the inclined connection plate section 73 are disposed in a Z shape as viewed from the side in the X-direction (see in an arrow C view in FIG. 16).

The bent section 74 is provided in an end portion in the Y-direction of the lower plate section 72 (an end portion on the opposite side to the side to be connected to the inclined connection plate section 73), and has an inclined shape protruding upward in the Z-direction toward the distal end side in the Y-direction.

A fitting hole 75 is formed in the inclined connection plate section 73. As illustrated in an arrow A view in FIG. 16, the fitting hole 75 is a through hole having a hexagonal shape in a planar view having inner surfaces to be respectively fitted into six side surfaces 30*b* in a nut 30. The inner surface of the fitting hole 75 includes a pair of side surface sections 75*a* disposed to be spaced apart from each other in the X-direction and extending in the Y-direction, a pair of end surface sections 75*b* disposed on one side in the Y-direction, and a pair of end surface sections 75*c* disposed on the other side in the Y-direction. The pair of end surface sections 75*b* and the pair of end surface sections 75*c* are respectively surfaces inclined in the X-direction and the Y-direction in a planar view.

In the fastening section 70, a nut housing section is formed by the upper plate section 71 and the lower plate section 72 substantially parallel to each other and the fitting hole 75 provided in the inclined connection plate section 73 between the upper plate section 71 and the lower plate section 72. The nut housing section in the fastening section 70 is closed by the upper plate section 71 and the lower plate section 72 on both sides in the Z-direction, and both sides thereof in the X-direction and the Y-direction are respectively closed by the inner surfaces of the fitting hole 75.

The nut 30 is housed in the nut housing section in the fastening section 70. In the nut 30 in the nut housing section, an upper surface 30*d* and a lower surface 30*e* are sandwiched by the upper plate section 71 and the lower plate section 72 to regulate movement of the nut 30 in the Z-direction. The side surfaces 30*b* of the nut 30 respectively contact the inner surfaces (the pair of side surface sections 75*a*, the pair of end surface sections 75*b*, the pair of end surface sections 75*c*) of the fitting hole thereby regulating rotation of the nut 30 around a screw hole 30*a* and movements of the nut 30 in the X-direction and the Y-direction.

The bent section 74 prevents the nut 30 from coming off the fitting hole 75 to drop toward the outside of the nut housing section. The pair of end surface sections 75*b* and the pair of end surface sections 75*c* in the fitting hole 75 are associated with regulation of movement of the nut 30 in the Y-direction. The inclined connection plate section 73 having the fitting hole 75 has such an inclination that the height thereof in the Z-direction changes in the Y-direction. Accordingly, the pair of end surface sections 75*b* and the pair of end surface sections respectively contact the side surfaces 30*b* of the nut in the vicinity of its upper end and in the vicinity of its lower end in the Z-direction close to the upper plate section 71 and the lower plate section 72 (see in an arrow C view in FIG. 16). The bent section 74 is provided on an extension line in the Y-direction of the inclined connection plate section 73, thereby making it possible to prevent an operation for the nut 30 to come off the pair of end surface sections 75*b* and slide in the Y-direction.

Thus, in the fastening section 70, the nut 30 is held while being sandwiched in the Z-direction by the upper plate section 71 and the lower plate section 72, and the inclined connection plate section 73 further includes a holding section (the fitting hole 75) that regulates rotation of the nut 30 and movements of the nut 30 in directions (the Y-direction and the X-direction) intersecting the Z-direction.

The fastening section 70 can be applied as fastening sections 16*a*, 17*a*, 18*a* in a semiconductor apparatus 1, like the above-described fastening section 40. When a fastening screw 31 is threaded into the nut 30 held by the fastening section 70, an external conductor 36 can be fastened to the fastening section 70.

Figure 15:
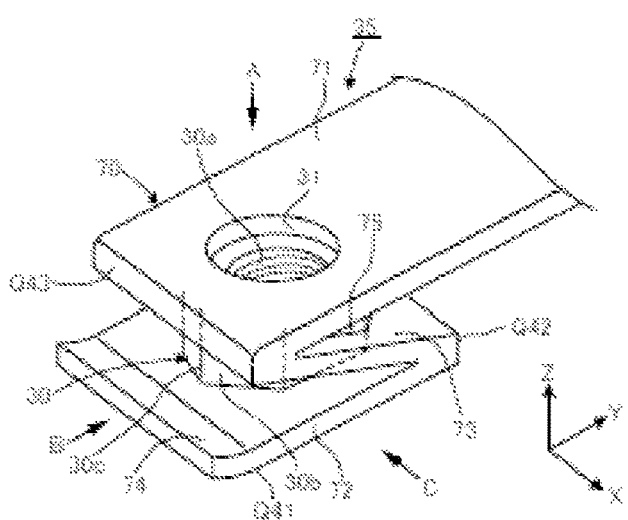
FIG. 15 is a perspective view of a fastening section in a terminal structure according to a fourth embodiment.
Figure 16:
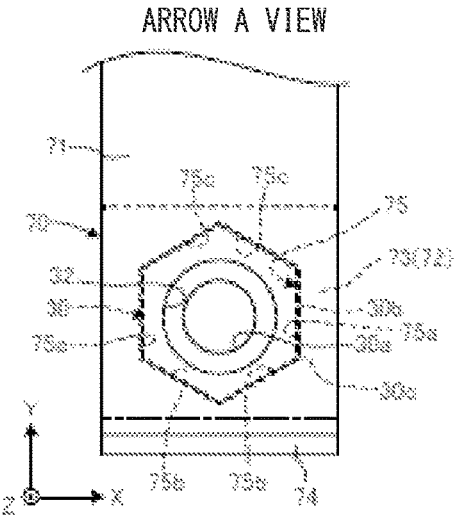
FIG. 16 is a diagram illustrating the fastening section according to the fourth embodiment in a planar view, a front view, and a side view.
Figure 16:
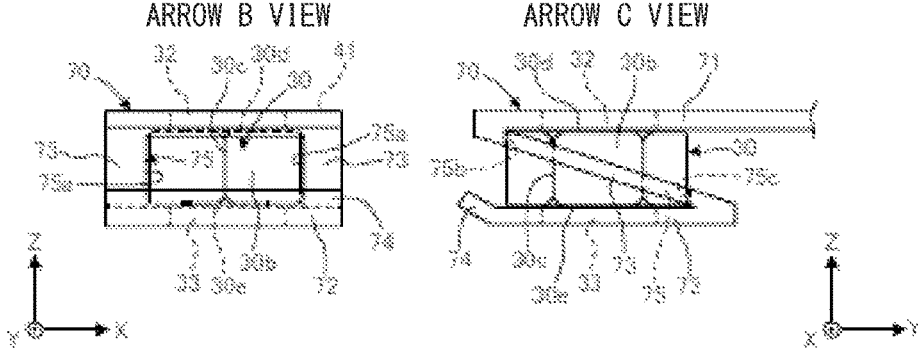

Although the pair of side surfaces 30*b* of the nut 30 is parallel to the Y-direction in a configuration illustrated in FIG. 15 and FIG. 16, an orientation of a rotation direction of the nut 30 in the fastening section is not limited to this. The orientation of the rotation direction of the nut 30 can be arbitrarily set depending on a shape and an orientation of the fitting hole 75 constituting the fastening section 70. For example, the pair of side surfaces 30*b* of the nut 30 may be configured to be parallel to the X-direction.

Figure 17:
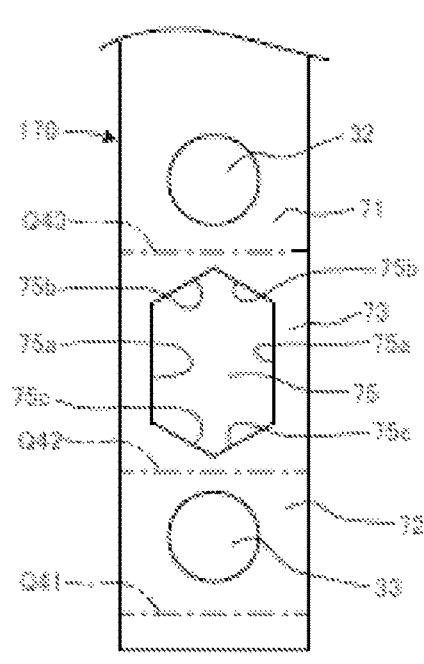
FIG. 17 is a development view of the fastening section according to the fourth embodiment.

As illustrated in FIG. 15, the fastening section 70 is configured by bending at a respective predetermined angle at each of a boundary section Q41 between the bent section 74 and the lower plate section 72, a boundary section Q42 between the lower plate section 72 and the inclined connection plate section 73, and a boundary section Q43 between the lower plate section 72 and the upper plate section 71. FIG. 17 illustrates a plate-shaped body 170 having a developed shape that has not yet been bent at each of the boundary sections Q41, Q42, Q43. The fitting hole has a shape close to a regular hexagon that matches an outer shape of the nut 30 in a planar view (an arrow A view in FIG. 16) with the inclined connection plate section 73 inclined. Accordingly, in the plate-shaped body 170 in a developed state where the whole thereof is flat (a portion corresponding to the inclined connection plate section 73 is not inclined), the fitting hole 75 has a shape of an irregular hexagon in which the length of the side surface section 75*a* is larger than the respective lengths of the end surface section 75*b* and the end surface section 75*c*. In FIG. 17, a portion to be each of boundary sections Q41, Q42, Q43 after the plate-shaped body 170 is bent is virtually indicated by a one-dot and dash line.

A method for manufacturing the fastening section 70 will be described with reference to FIG. 17 and FIG. 18. First, as illustrated in FIG. 17, one plate-shaped body 170 made of metal is subjected to press working (punching processing), for example, to form sites respectively corresponding to a through hole 32, a through hole 33, and a fitting hole 75.

Figure 18:
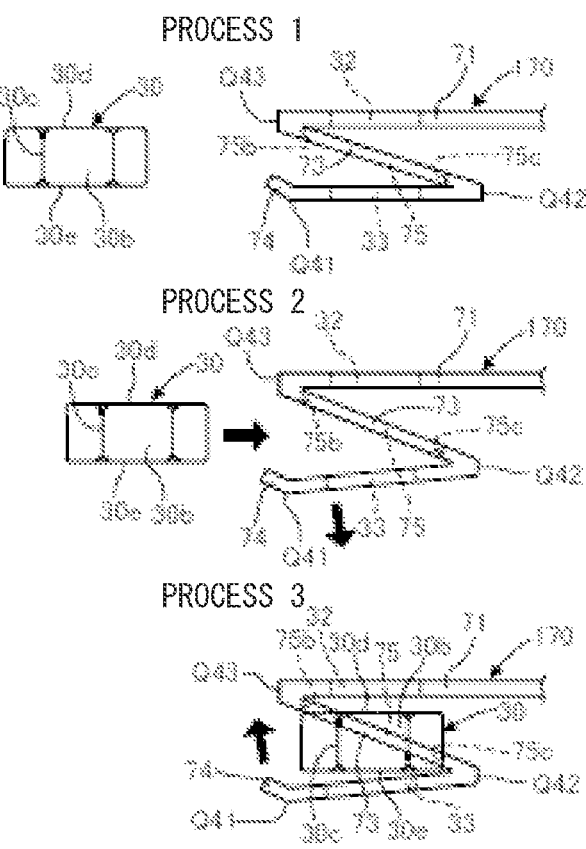
FIG. 18 is a diagram illustrating processes for forming the fastening section according to the fourth embodiment.

Then, as illustrated in a process 1 in FIG. 18, the plate-shaped body 170 is subjected to bending processing at a predetermined bending angle at each of respective portions of boundary sections Q41, Q42, Q43, to have a shape including an upper plate section 71, a lower plate section 72, an inclined connection plate section 73, and a bent section 74. Then, as illustrated in a process 2, the plate-shaped body 170 is elastically deformed to increase a spacing between the upper plate section 71 and the lower plate section 72, and a nut 30 is inserted in the Y-direction into a nut housing section from the side of its one end portion in the Y-direction. At this time, the upper plate section 71 and the lower plate section 72 are at such an opening angle as not for the bent section 74 to prevent insertion of the nut 30. Then, as illustrated in a process 3, when the nut 30 is inserted in the Y-direction until a side surface 30*b* contacts a pair of end surface sections 75*c* in the fitting hole 75, the elastic deformation of the plate-shaped body 170 is eliminated, to return the spacing between the upper plate section 71 and the lower plate section 72 to its original spacing. Accordingly, there occurs a state where an upper surface 30d and a lower surface 30e of the nut 30 are held between the upper plate section 71 and the lower plate section 72 and the nut 30 is sandwiched by a pair of end surface sections 75b and a pair of end surface sections 75c in the Y-direction, thereby completing the fastening section 70.

According to the above-described manufacturing method, when the nut 30 is inserted after the plate-shaped body 170 is bent in each of its portions in the longitudinal direction, the fastening section 70 can be formed. The fastening section 70 is manufactured by pre-processing (press working, etc.) for forming the through hole 32, the through hole 33, and the fitting hole 75 in the plate-shaped body 170 and bending processing for bending the plate-shaped body 170 at the plurality of boundary sections Q41, Q42, Q43 all extending in the same direction (the X-direction). Accordingly, the fastening section 70 can be manufactured with efficiency and at low cost without requiring a complicated work process.

Each of its portions in the plate-shaped body 170 is previously brought into a bent state, and the nut 30 can be assembled thereto later, thereby increasing degrees of freedom of manufacture and distribution of the fastening section 70.

The method for manufacturing the fastening section 70 is not limited to the foregoing. For example, the bent section 74 may be formed by bending the plate-shaped body 170 at the boundary section Q41 after the nut 30 is inserted in a state where the plate-shaped body 170 has not yet been bent at the boundary section Q41 and the nut 30 is fitted into the fitting hole 75. The bent section 74 has not yet been formed when the nut 30 is assembled. Accordingly, even if the plate-shaped body 170 is of a type in which it is not elastically deformed or its amount of elastic deformation is small, the nut 30 can be inserted into the nut housing section.

The fastening section 70 described above makes it possible to obtain a similar effect to that in the above-described fastening section 40. Further, a structure of the fastening section 70 can be further simplified because a function of a holding section that regulates rotation of the nut 30 and regulates movements of the nut 30 in directions (the X-direction and the Y-direction) intersecting the thickness direction is concentrated on the fitting hole 75 in the inclined connection plate section 73 that connects the upper plate section 71 and the lower plate section 72 to each other.

The fastening section 70 does not include a structure for closing an end portion in the Y-direction between the upper plate section 71 and the lower plate section 72, thereby making it easy to visually recognize a state where the nut 30 is mounted on the nut housing section in both the X-direction and the Y-direction.

Further, the fastening section 70 does not include a structure for closing an end portion in the Y-direction between the upper plate section 71 and the lower plate section 72, whereby the nut 30 can be inserted in the Y-direction after the fastening section 70 is formed in a Z shape in a side view, resulting in a high degree of freedom of manufacture.

As described above, each of the fastening sections 40, 50, 60, and 70 in the embodiments to which the present invention is applied makes it possible to obtain a terminal structure into which a nut can be incorporated with a simple configuration and at low cost and a method for manufacturing the terminal structure. When the terminal structure is applied to a semiconductor apparatus, it is possible to implement a simplification of a configuration, an improvement in productivity, and a reduction in manufacturing cost, for example, in the semiconductor apparatus.

The present invention is not limited to the above-described embodiments, but can be implemented by making various changes. In the above-described embodiments, a size, a shape, an orientation, and the like illustrated in the accompanying drawings are not limited to these, but are appropriately changeable within a range in which the effect of the present invention is exhibited. In addition thereto, the present invention can be implemented by making appropriate changes without departing from the scope of the object of the prevent invention.

For example, the number and a layout of each member constituting the semiconductor apparatus 1 are not limited to the configurations in the above-described embodiments, but are appropriately changeable. The number of the unit modules 2 may be changed to also apply the unit modules to an inverter circuit other than a three-phase inverter circuit, like in the semiconductor apparatus 1.

Although a hexagonal nut is used as the nut 30 to be housed in each of the fastening sections 40, 50, 60 and 70 in the above-described embodiments, a nut other than the hexagonal nut may be used. For example, a square nut or a triangular nut may be used. In this case, an inner surface shape of each of the fitting recesses 57, 67 as illustrated corresponding to the hexagonal nut may be changed to one corresponding to the square nut or the triangular nut. Thus, the terminal structure according to the present invention is widely applicable to nuts respectively having various polygonal shapes.

Although the plate-shaped body is bent downward with respect to each of the upper plate sections 41, 51, 61, and 71 in the above-described embodiments to form the nut housing section, a top-bottom direction in the fastening section may be reversed. That is, the fastening section may have a structure in which each of the upper plate sections 41, 51, 61, and 71 supports the lower surface 30e of the nut 30 and the plate-shaped body is bent upward from the upper plate section 41, 51, 61, and 71 to surround the nut 30.

In the above-described embodiment, in the fitting holes 43a, 63a and the notch section 45a, the inner surface portion that contacts the side surface 30b of the nut 30 is set as a surface parallel to the Y-direction in a planar view. That is, the inner surface portion has a shape that contacts the side surface 30b of the nut 30 in a linear region extending in the Z-direction. When the upper surface portion has such a shape, the fitting holes 43a, 63a and the notch section 45a can be formed by simple processing using a tool that moves in a plate thickness direction of the plate-shaped body 140 and the plate-shaped body 160 in performing pre-processing for the plate-shaped body 140 and the plate-shaped body 160. However, as a modification, inner surfaces of the fitting holes 43a, 63a and inner surfaces of the notch section 45a are each set to have a tapered shape along the side surface 30b in a planar view so that a contact area with the nut 30 may be enlarged.

Although the embodiments and modifications have been described, the present invention may be an overall or partial combination of the above-described embodiments and modifications as other embodiments.

The present invention is not limited to the above-described embodiments and modifications, but various changes, replacements, and modifications may be made without departing from the spirit of the technical idea. Further, if the technical idea can be implemented using another method by advancement of technology or derivative other technologies, the technical idea may be implemented using the method. Therefore, the claims cover all implementations that can be included in the scope of the technical idea.

Feature points in the above-described embodiments are summarized below.

A terminal structure according to the above-described embodiments is a terminal structure capable of holding a nut, the terminal structure including a pair of plate sections that are provided spaced apart from each other in a thickness direction of the nut and between which the nut can be sandwiched from both sides in the thickness direction, a connection plate section that extends in the thickness direction of the nut and connects respective one end portions of the pair of plate sections to each other, a terminal section that protrudes from the other end portion of a first plate section in the pair of plate sections and is arranged to oppose the connection plate section, and a holding section that is provided in at least one of the connection plate section and the terminal section and regulates rotation of the nut and movement of the nut in a direction intersecting the thickness direction, in which the pair of plate sections, the connection plate section, the terminal section, and the holding section are constituted by one plate-shaped body.

In the terminal structure according to the above-described embodiments, the nut has an outer surface having a polygonal shape, and the holding section has a fitting hole that is provided in the connection plate section and into which an outer surface of the nut can be fitted.

In the terminal structure according to the above-described embodiments, the terminal section includes an upstanding wall section extending in the thickness direction of the nut from the other end portion of the first plate section, and the holding section includes a notch section that is provided in the upstanding wall section and into which an outer surface of the nut can be fitted.

In the terminal structure according to the above-described embodiments, the nut has an outer surface having a polygonal shape, the terminal section includes an upstanding wall section extending in the thickness direction of the nut from the other end portion of the first plate section and a holding plate section extending toward the connection plate section from the upstanding wall section, and the holding section includes a fitting recess that is provided in the holding plate section and into which an outer surface of the nut can be fitted.

A manufacturing method for forming the terminal structure according to the above-described embodiments includes the steps of forming the holding section in the plate-shaped body having a developed shape that has not yet formed the pair of plate sections, the connection plate section, and the terminal section, and subjecting the plate-shaped body to bending processing at respective boundaries among the pair of plate sections, the connection plate section, and the terminal section.

In the terminal structure manufacturing method according to the above-described embodiments, the nut is inserted after the terminal section is formed by the bending processing for the first plate section and at least before the boundary between the second plate section in the pair of plate sections and the connection plate section is subjected to bending processing.

The terminal structure according to the above-described embodiments is a terminal structure capable of holding a nut, the terminal structure including a pair of plate sections that are provided spaced apart from each other in a thickness direction of the nut and between which the nut can be sandwiched from both sides in the thickness direction, an inclined connection plate section that extends in a direction intersecting the pair of plate sections and the thickness direction and connects respective end portions of the pair of plate sections to each other, and a holding section that is provided in the inclined connection plate section and regulates rotation of the nut and movement of the nut in a direction intersecting the thickness direction.

In the terminal structure according to the above-described embodiments, the nut has an outer surface having a polygonal shape, and the holding section has a fitting hole that penetrates the inclined connection plate section in the thickness direction and into which an outer surface of the nut can be fitted.

In the terminal structure according to the above-described embodiments, one of the pair of plate sections includes a bent section, which regulates movement of the nut in a direction intersecting the thickness direction, in an end portion opposite to a side to which the inclined connection plate section is connected.

A manufacturing method for forming the terminal structure according to the above-described embodiments includes the steps of forming the holding section in a plate-shaped body having a developed shape that has not yet formed the pair of plate sections and the inclined connection plate section, and subjecting the plate-shaped body to bending processing at respective boundaries of the pair of plate sections and the inclined connection plate section.

In the terminal structure manufacturing method according to the above-described embodiments, a spacing between the pair of plate sections is increased by elastic deformation to insert the nut between the pair of plate sections after the pair of plate sections and the inclined connection plate section are formed.

A semiconductor apparatus according to the above-described embodiments includes the above-described terminal structure.

As described above, the present invention has an effect of being able to obtain a terminal structure of a nut incorporated type with a simple configuration and at low cost and is particularly useful in a semiconductor apparatus for industrial or electrical use, for example.

REFERENCE SIGNS LIST

1: semiconductor apparatus
2: unit module
4: case member
5: sealing resin
6: insulating substrate
7: semiconductor device
8: base plate
10: metal wiring board
16: P terminal
16$a$: fastening section
17: N terminal
17$a$: fastening section
18: M terminal
18$a$: fastening section
19: control terminal
20: insulating plate
21: heat dissipation plate
22: circuit board
26: recess
27: recess
28: recess
30: nut
30$a$: screw hole 30 *b*: side surface (outer surface of nut)
30 *c*: ridge line section
30 *d*: upper surface
30 *e*: lower surface
30*f*: corner section
31: fastening screw
32: through hole
33: through hole
35: main terminal
36: external conductor
40: fastening section
41: upper plate section (a pair of plate sections, second plate section)
42: lower plate section (a pair of plate sections, first plate section)
43: connection plate section
43*a*: fitting hole (holding section)
44: terminal section
45: upstanding wall section
45*a*: notch section (holding section)
50: fastening section
51: upper plate section (a pair of plate sections, second plate section)
52: lower plate section (a pair of plate sections, first plate section)
53: connection plate section (holding section)
54: terminal section
55: upstanding wall section
56: holding plate section
57: fitting recess (holding section)
57*a*: bottom surface section
57*b*: tapered surface section
60: fastening section
61: upper plate section (a pair of plate sections, second plate section)
62: lower plate section (a pair of plate sections, first plate section)
63: connection plate section
63*a*: fitting hole (holding section)
64: terminal section
65: upstanding wall section
65*a*: notch section
66: holding plate section
67: fitting recess (holding section)
67*a*: tapered surface section
67*b*: side surface section
70: fastening section
71: upper plate section (a pair of plate sections)
72: lower plate section (a pair of plate sections)
73: inclined connection plate section
74: bent section
75: fitting hole (holding section)
75*a*: side surface section
75*b*: end surface section
75*c*: end surface section
140: plate-shaped body
150: plate-shaped body
160: plate-shaped body
170: plate-shaped body

What is claimed is:

1. A terminal structure capable of holding a nut, the terminal structure comprising:

a pair of plate sections including a first plate section and a second plate section each extending in a plate direction, the pair of plate sections being spaced apart from each other in a thickness direction of the nut so as to respectively physically contact respective opposite sides of the nut in the thickness direction to restrict movements of the nut;

a connection plate section that extends in the thickness direction of the nut and connects one of two ends in the plate direction of each of the first and second plate sections to each other;

a terminal section that protrudes from the other one of the two ends of the first plate section and faces the connection plate section; and a holding section provided at at least one of the connection plate section or the terminal section, the holding section physically contacting the nut to restrict rotation of the nut and movement of the nut in a direction orthogonal to the thickness direction, wherein the pair of plate sections, the connection plate section, the terminal section, and the holding section are constituted by one plate-shaped body.

2. The terminal structure according to claim 1, wherein the nut has an outer surface having a polygonal shape, and the holding section has a fitting hole provided in the connection plate section, an outer surface of the nut being fittable in the fitting hole.

3. The terminal structure according to claim 1, wherein the terminal section includes an upstanding wall section extending in the thickness direction of the nut from the other one of the two ends of the first plate section, and the holding section is provided in the terminal section and includes a notch provided in the upstanding wall section, an outer surface of the nut being fittable into the notch.

4. The terminal structure according to claim 1, wherein the nut has an outer surface having a polygonal shape, the terminal section includes an upstanding wall section extending in the thickness direction of the nut from the other one of the two ends of the first plate section and a holding plate section extending toward the connection plate section from the upstanding wall section, and the holding section is provided in the terminal section, and includes a fitting recess provided in the holding plate section, an outer surface of the nut being fittable into the fitting recess.

5. A manufacturing method for forming the terminal structure according to claim 1, the terminal structure manufacturing method comprising the steps of:

forming the holding section in a flat base plate; and bending the base plate along respective bending lines in a width direction of the base plate, which are to be respective boundaries between the terminal section and the first plate section, between the first plate section and the connection section, between the connection section and the second plate section, thereby to form the terminal structure that includes the pair of plate sections including the first and second plate sections, the connection plate section, and the terminal section, wherein each of the first and second plate section extends in a plate direction, the first and second plate sections being spaced apart from each other in a thickness direction of the nut so as to respectively physically contact respective opposite sides of the nut in the thickness direction to restrict movements of the nut;

the connection plate section extends in the thickness direction of the nut and connects one of two ends in the plate direction of each of the first and second plate sections to each other;

the terminal section that protrudes from the other one of the two ends of the first plate section and faces the connection plate section; and the holding section provided at at least one of the connection plate section or the terminal section, the holding section physically contacting the nut to restrict rotation of the nut and movement of the nut in a direction orthogonal to the thickness direction.

6. The terminal structure manufacturing method according to claim 5, wherein the nut is inserted between the first and second plate sections after bending the base plate along the bending line that is configured to be a boundary between the first plate section and the terminal section to form the terminal section, at least before bending the base plate along the bending line that is configured to be a boundary between the second plate section and the connection section.

7. A semiconductor apparatus comprising the terminal structure according to claim 1.

8. A terminal structure capable of holding a nut, the terminal structure comprising:

a pair of plate sections including a first plate section and a second plate section each extending in a plate direction, the pair of plate sections being spaced apart from each other in a thickness direction of the nut so as to respectively contact respective opposite sides of the nut in the thickness direction to restrict movements of the nut;

an inclined connection plate section that extends in a direction different from the plate direction and the thickness direction, and connects one of two ends in the plate direction of each of the first and second plate sections to each other; and a holding section provided at at least one of the connection plate section or the terminal section, the holding section physically contacting the nut to restrict rotation of the nut and movement of the nut in a direction orthogonal to the thickness direction, wherein the pair of plate sections, the inclined connection plate section, and the holding section are constituted by one plate-shaped body.

9. The terminal structure according to claim 8, wherein the nut has an outer surface having a polygonal shape, and the holding section has a fitting hole that penetrates through the inclined connection plate section in a thickness direction thereof, an outer surface of the nut being fittable into the fitting hole.

10. The terminal structure according to claim 8, wherein the first plate section includes a bent section at the other one of the two ends thereof opposite to the one of the two ends thereof to which the inclined connection plate section is connected, the bent section restricting movement of the nut in a direction orthogonal to the thickness direction.

11. A manufacturing method for forming the terminal structure according to claim 8, the terminal structure manufacturing method comprising the steps of:

forming the holding section in a flat base plate; and after the forming the holding section, bending the base plate along respective bending lines in a width direction of the base plate, the bending lines to be respective boundaries between the first plate section and the inclined connection plate section, between the inclined connection plate section and the second plate section, thereby to form the pair of plate sections including the first plate section and the second plate section, the inclined connection plate section, and the holding section, wherein the first and second plate sections are spaced apart from each other in a thickness direction of the nut so as to respectively physically contact respective opposite sides of the nut in the thickness direction to restrict movements of the nut;

the inclined connection plate section that extends in a direction different from the plate direction and the thickness direction, and connects one of two ends in the plate direction of each of the first and second plate sections to each other;

the holding section provided at at least one of the connection plate section or the terminal section, the holding section physically contacting the nut to restrict rotation of the nut and movement of the nut in a direction orthogonal to the thickness direction.

12. The terminal structure manufacturing method according to claim 11, further comprising after the bending the base plate to form the first and second sections and the inclined connection plate section, increasing a space between the first and second plate sections by elastic deformation and inserting the nut between the first and second plate sections.

13. A semiconductor apparatus comprising the terminal structure according to claim 8.

* * * * *